(12) United States Patent
Wang et al.

(10) Patent No.: US 12,150,405 B2
(45) Date of Patent: Nov. 26, 2024

(54) MOTOR HOUSING FOR A RIDING LAWN MOWER

(71) Applicant: Nanjing Chervon Industry Co., Ltd., Nanjing (CN)

(72) Inventors: Zhen Wang, Nanjing (CN); Toshinari Yamaoka, Nanjing (CN); Xi Chen, Nanjing (CN); Fan Gao, Nanjing (CN); Dezhong Yang, Nanjing (CN); Lei Wang, Nanjing (CN); Cheng Dai, Nanjing (CN); Qiqi Yin, Nanjing (CN); Zhongning Ding, Nanjing (CN)

(73) Assignee: Nanjing Chervon Industry Co., Ltd. (CN)

( * ) Notice: Subject to any disclaimer, the term of this patent is extended or adjusted under 35 U.S.C. 154(b) by 748 days.

(21) Appl. No.: 17/372,217

(22) Filed: Jul. 9, 2021

(65) Prior Publication Data
US 2021/0329836 A1    Oct. 28, 2021

Related U.S. Application Data

(63) Continuation of application No. PCT/CN2020/071382, filed on Jan. 10, 2020.

(30) Foreign Application Priority Data

Jan. 11, 2019  (CN) .......................... 201910028613.9
Apr. 24, 2019  (CN) .......................... 201910335554.X
Dec. 31, 2019  (CN) .......................... 201911407269.0

(51) Int. Cl.
*A01D 34/78*  (2006.01)
*A01D 34/64*  (2006.01)
(Continued)

(52) U.S. Cl.
CPC ............ *A01D 34/78* (2013.01); *A01D 34/64* (2013.01); *A01D 69/02* (2013.01); *H05K 3/284* (2013.01);
(Continued)

(58) Field of Classification Search
CPC ...... A01D 34/778; A01D 34/64; A01D 69/02; A01D 2101/00; A01D 34/822;
(Continued)

(56) References Cited

U.S. PATENT DOCUMENTS 3,034,275 A * 5/1962 Reynold ................ A01D 34/84
                                                       37/189
3,044,239 A * 7/1962 Harkness ........... A01D 34/6806
                                                       123/185.14
(Continued)

FOREIGN PATENT DOCUMENTS

CA       2150531 A1 * 12/1996 ............. A01D 69/02
CN    103371032 A    10/2013
(Continued)

OTHER PUBLICATIONS

ISA/CN, Int. Search Report issued on PCT application No. PCT/CN2020/071382, dated Mar. 26, 2020, 2 pages.
(Continued)

*Primary Examiner* — Arpad Fabian-Kovacs
(74) *Attorney, Agent, or Firm* — Greenberg Traurig, LLP

(57) ABSTRACT

A riding lawn mower includes: a seat; a frame; a mowing element; a deck surrounding and forming a mowing space for accommodating at least part of the mowing element; and a first motor for driving the mowing element to rotate. The first motor includes a rotor assembly including a rotor shaft enabled to rotate about a rotation axis and a stator assembly, a motor housing surrounding and forming an accommodation cavity for accommodating at least part of the stator
(Continued)

assembly. The rotor shaft passes through the motor housing in a direction of the rotation axis and is at least partially located outside the motor housing; the deck is provided with a first through hole for the first motor to pass through so that the motor housing is at least partially located in the mowing space. The first motor of the riding lawn mower has a good cooling effect.

19 Claims, 24 Drawing Sheets

(51) Int. Cl.
*A01D 69/02* (2006.01)
*H05K 3/28* (2006.01)
*A01D 101/00* (2006.01)

(52) U.S. Cl.
CPC .... *A01D 2101/00* (2013.01); *H05K 2203/095* (2013.01)

(58) Field of Classification Search
CPC ........ A01D 34/66; A01D 34/81; H05K 3/284; H05K 2203/095
See application file for complete search history.

(56) References Cited

U.S. PATENT DOCUMENTS

| | | | | |
|---|---|---|---|---|
| 3,230,695 | A * | 1/1966 | West | A01D 34/6806 318/762 |
| 3,593,505 | A * | 7/1971 | Mittelstadt | A01D 69/02 56/17.5 |
| 4,276,737 | A * | 7/1981 | Henning | A01D 34/695 56/12.8 |
| 5,819,513 | A * | 10/1998 | Braun | A01D 34/828 56/11.9 |
| 5,894,715 | A * | 4/1999 | Braun | A01D 34/74 56/320.1 |
| 8,277,948 | B2 | 7/2012 | Fox et al. | |
| 8,575,800 | B1 | 11/2013 | Fox et al. | |
| 9,210,839 | B2 * | 12/2015 | Schygge | B60L 50/60 |
| 9,840,143 | B1 * | 12/2017 | Keller | F16H 57/04 |
| 10,426,084 | B2 * | 10/2019 | Ito | A01D 34/78 |
| 11,641,795 | B2 * | 5/2023 | Xu | A01D 34/733 56/17.5 |
| 11,708,831 | B1 * | 7/2023 | Castle | F04B 53/08 415/111 |
| 11,925,142 | B2 * | 3/2024 | Schuller-Rach | A01D 34/733 |
| 2006/0059879 | A1 | 3/2006 | Edmond | |
| 2007/0234699 | A1 | 10/2007 | Berkeley | |
| 2009/0183482 | A1 * | 7/2009 | Cheung | A01D 34/824 56/17.1 |
| 2011/0239613 | A1 * | 10/2011 | Isono | H02K 13/006 56/255 |
| 2014/0137528 | A1 | 5/2014 | Schygge et al. | |
| 2014/0165524 | A1 * | 6/2014 | Schygge | B60L 1/16 180/62 |
| 2015/0007541 | A1 | 1/2015 | Albinger | |
| 2015/0047310 | A1 * | 2/2015 | Schreiner | A01D 34/005 56/320.1 |
| 2015/0359170 | A1 | 12/2015 | Ito et al. | |
| 2016/0183451 | A1 | 6/2016 | Conrad | |
| 2016/0193970 | A1 | 7/2016 | Takaoka | |
| 2017/0263914 | A1 | 9/2017 | Ito | |
| 2018/0303027 | A1 | 10/2018 | Koike | |
| 2019/0381988 | A1 | 12/2019 | Matsuda | |
| 2020/0052558 | A1 * | 2/2020 | Kouda | A01D 34/78 |
| 2020/0112227 | A1 * | 4/2020 | Kouda | H02K 5/08 |
| 2020/0343789 | A1 * | 10/2020 | Fogle | H02K 1/28 |
| 2021/0105939 | A1 * | 4/2021 | Zeiler | A01D 34/82 |
| 2021/0143650 | A1 | 5/2021 | Wang | |
| 2021/0329836 | A1 | 10/2021 | Wang | |
| 2022/0416608 | A1 * | 12/2022 | Ichioka | H02K 3/522 |
| 2022/0416625 | A1 * | 12/2022 | Inuzuka | A01D 34/6806 |

FOREIGN PATENT DOCUMENTS

| | | |
|---|---|---|
| CN | 10381398 A | 5/2014 |
| CN | 103813918 A | 5/2014 |
| CN | 103974610 A | 3/2017 |
| CN | 207354879 A | 5/2018 |
| CN | 207354879 U | 5/2018 |
| CN | 208285834 U | 12/2018 |
| EP | 0856244 B1 | 6/2004 |
| EP | 1275285 B1 | 9/2006 |
| EP | 3486109 A1 | 9/2021 |
| EP | 3892081 A1 | 10/2021 |
| GB | 2083733 A | 3/1982 |
| JP | 2018085970 A | 6/2018 |
| WO | 2012098723 A1 | 7/2012 |
| WO | 2013009311 A2 | 1/2013 |
| WO | 2018123568 A1 | 7/2018 |
| WO | WO-2019123659 A1 * | 6/2019 ............. A01D 34/68 |

OTHER PUBLICATIONS

Office Action from EP application No. 20738266.4, dated May 8, 2023, 5 pp.
European Patent Office, Supplementary Search Report issued on European publication No. 3892081, dated Jan. 5, 2022, 13 pages.

* cited by examiner

MOTOR HOUSING FOR A RIDING LAWN MOWER

The present application is a continuation of International Application Number PCT/CN2020/071382, filed on Jan. 10, 2020, through which this application claims the benefit of Chinese Patent Application No. 201910028613.9, filed on Jan. 11, 2019, Chinese Patent Application No. 201910335554.X, filed on Apr. 24, 2019, and Chinese Patent Application No. 201911407269.0, filed on Dec. 31, 2019, which applications are incorporated herein by reference in their entirety.

BACKGROUND

As a gardening tool, lawn mowers are widely used to trim lawn and vegetation. Lawn mowers in the related art generally include handheld lawn mowers and riding lawn mowers. In the market, riding lawn mowers are usually powered by diesel fuel, which not only pollutes the environment, but also requires frequent replacement of the wearing parts in the fuel system, causing increased maintenance costs. For riding lawn mowers, the output power of the motor is relatively high, so the temperature rise of the motor during operation has always been an urgent problem to be solved.

SUMMARY

This disclosure provides a riding lawn mower with good cooling effect.

This disclosure adopts the following technical solutions:

In one example a riding lawn mower includes: a seat for a user to sit thereon; a mowing element for cutting vegetation, a deck surrounding and forming a mowing space for accommodating at least part of the mowing element, and a first motor configured to drive the mowing element to rotate relative to the deck; the first motor includes: a rotor assembly including a rotor shaft enabled to rotate about a rotation axis; a stator assembly including a stator coil and a stator core; and a motor housing surrounding and forming an accommodation cavity for accommodating at least part of the stator assembly; wherein the rotor shaft passes through the motor housing in the direction of the rotation axis and is at least partially located outside the motor housing; the deck is formed with a first through hole for the first motor to pass through such that the motor housing is at least partially located in the mowing space.

In one example, the first through hole passes through the deck along the direction of the rotation axis.

In one example, the deck is recessed toward the mowing element to form a groove, and the first through hole is provided at a bottom of the groove.

In one example, the motor housing is formed with a mounting portion for mounting the first motor to the deck; the deck is formed with a supporting portion around the first through hole for supporting the mounting portion; wherein a dimension of the mounting portion in a radial direction perpendicular to the rotation axis is larger than a dimension of the first through hole in this direction.

In one example, an airflow channel communicating with the first through hole is formed between the supporting portion and the mounting portion; when the mowing element rotates, the airflow channel allows a cooling airflow outside the mowing space to pass through the airflow channel and the first through hole to enter the mowing space.

In one example, when the mowing element rotates, a cooling airflow that flows from an outside of the mowing space through the first motor and into the inside of the mowing space through the first through hole is generated.

In one example, the motor housing includes: a first housing portion formed with a second through hole for the rotor shaft to pass through along a longitudinal bearing; and a second housing portion butted with the first housing portion to surround and form the accommodation cavity.

In one example, the first motor further includes a fastener for fastening the first housing portion and the second housing portion together; the fastener passes through the deck to mount the first motor to the deck.

In one example, the first housing portion is formed with a first flange portion extending in a radial direction perpendicular to the rotation axis, and the second housing portion is formed with a second flange portion extending in a radial direction perpendicular to the rotation axis; the first motor further includes a fastener sequentially passing through the deck, the first flange portion and the second flange portion.

In one example, the ratio of a size of a portion of the motor housing in the mowing space in the direction of the rotation axis to a size of the motor housing in the direction of the rotation axis is greater than or equal to 0.3 and less than or equal to 1.

In one example a lawn mower includes: a mowing element for cutting vegetation, a deck surrounding and forming a mowing space for accommodating at least part of the mowing element, and a first motor configured to drive the mowing element to rotate relative to the deck; the first motor includes: a rotor assembly including a rotor shaft enabled to rotate about a rotation axis; a stator assembly including a stator coil and a stator core; and a motor housing surrounding and forming an accommodation cavity for accommodating at least part of the stator assembly; wherein the rotor shaft passes through the motor housing along the direction of the rotation axis and is at least partially located outside the motor housing; the deck is formed with a first through hole for the first motor to pass through so that the motor housing is at least partially located in the mowing space.

The first motor in the riding lawn mower of the present disclosure at least partially extends into the mowing space, so as to generate a cooling airflow for cooling the first motor.

DETAILED DESCRIPTION

Figure 1:
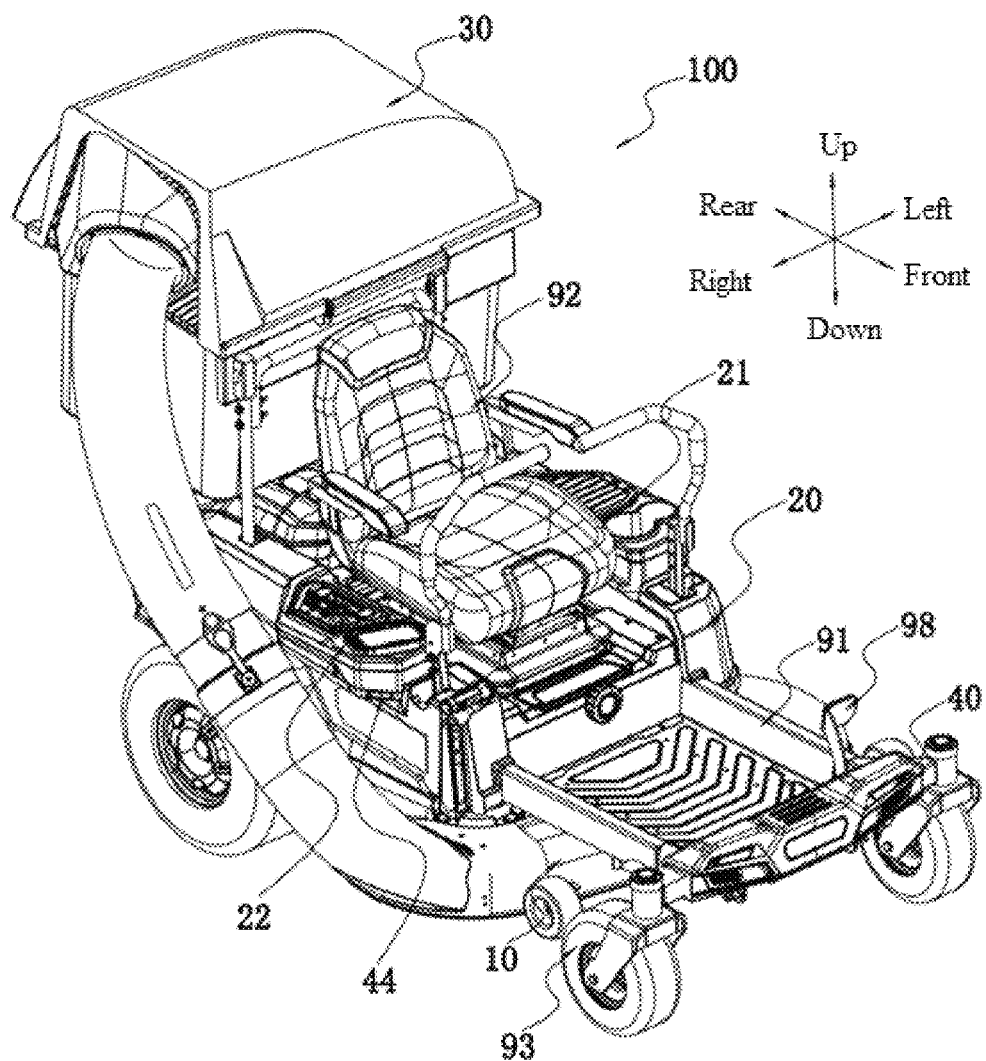
FIG. 1 is a perspective view of a riding lawn mower according to an example of the present disclosure.

The lawn mower shown in FIG. 1 is a riding lawn mower 100, and the riding lawn mower 100 can be controlled by a user to mow lawns and other vegetation.

In this specification, the front, rear, left, right, up, and down directions are defined as the directions shown in FIG. 1.

As shown in FIGS. 1-4, the riding lawn mower 100 includes: a cutting system 10, a frame 91, a seat 92, a housing system 20, a walking system 93, a power supply device 94, a grass catcher system 30, and a lighting system 40. Wherein the frame 91 and the housing system 20 form the body 100a of the riding lawn mower 100, and the body 100a is configured to install the cutting system 10, the seat 92, the power supply device 94, the grass catcher system 30 and the lighting system 40, and walking system 93 is configured to support the body 100a. In this example, the power supply device 94 supplies energy to the riding lawn mower 100, so that the riding lawn mower 100 can be used as an electric tool. Compared with fuel-based riding lawn mowers 100, the electric riding lawn mower 100 is more environmentally friendly and saves energy. Wherein the cutting system 10 is used to output power to realize the function of the riding lawn mower 100, the cutting system 10 is used as a power output member, and the body 100a supports the power output member. The cutting system 10 includes: a deck 11, a mowing element 12, and a first motor 13. The mowing element 12 is configured to cut vegetation during high speed rotation. For example, the mowing element 12 is a blade for cutting grass on the lawn. The deck 11 is formed around a mowing space 121 for accommodating at least a portion of the mowing element 12, and the first motor 13 is used to drive the mowing element 12 to rotate. The frame 91 is used to install the cutting system 10, and the frame 91 basically extends in the front and rear direction. The cutting system 10, the housing system 20, the walking system 93, the power supply device 94, the grass catcher device and the lighting system 40 are all installed on the frame 91. The frame 91 is main body part for supporting the entire riding lawn mower 100. The seat 92 is installed to the frame 91, and the seat 92 is used for the user to sit thereon, and the frame 91 carries the seat 92. The housing system 20 is used to carry some other structures. The walking system 93 is used to support the frame 91 so that the riding lawn mower 100 can walk on/move across a surface. The walking system 93 includes: front walking wheels 931 and rear walking wheels 932, and the walking system 93 also includes a second motor 933 for driving the front walking wheels 931 or the rear walking wheels 932 to rotate. The number of the front walking wheels 931 is two, and the number of the rear walking wheels 932 is also two. The power supply device 94 is used to provide power to the cutting system 10, the walking system 93, the lighting system 40, etc. The power supply device 94 includes at least one battery pack for storing electric energy, and the battery pack is a lithium battery pack. The grass catcher system 30 is used to collect grass clippings cut by the cutting system 10. The lighting system 40 is used for lighting. Wherein the first motor 13, the second motor 933, and the lighting system 40 are all used as electric devices included in the riding lawn mower 100, and these electric devices can convert electric energy into other forms of energy.

Figure 3:
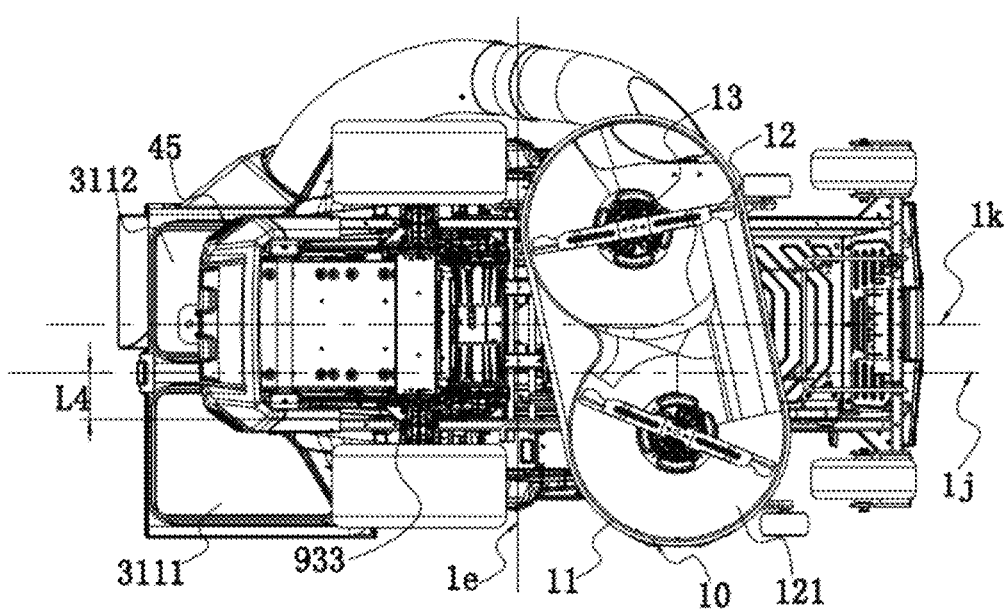
FIG. 3 is a bottom view of the riding lawn mower in FIG. 1.

As shown in FIGS. 1 and 3, the cutting system 10 is arranged on the lower side of the frame 91, so that the center of gravity of the riding lawn mower 100 can be effectively lowered. The number of mowing elements 12 is two, the number of first motors 13 is two, and the two first motors 13 drive the mowing elements 12 respectively. The mowing elements 12 are disposed in the mowing space 121 surrounded by the deck 11. The mowing space 121 opens downward, so that the mowing elements 12 can perform cutting operations on the vegetation located under the mowing space 121.

Figure 5:
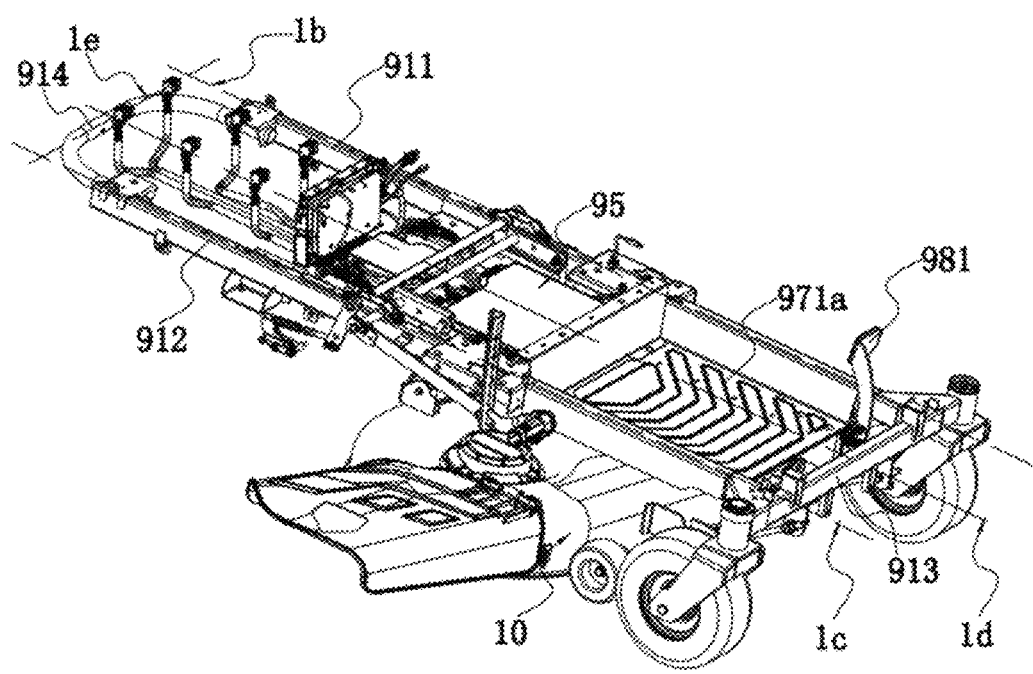
FIG. 5 is a perspective view of a frame and a cutting system of the riding lawn mower in FIG. 1.
Figure 6:
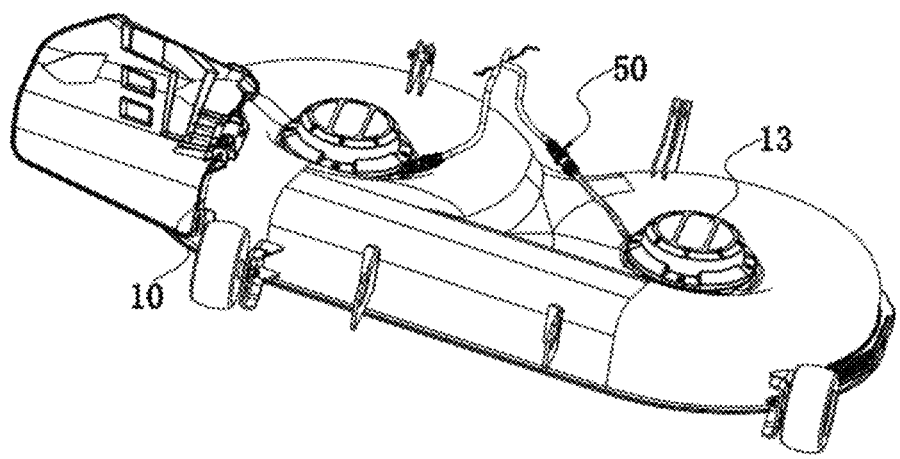
FIG. 6 is a perspective view of the cutting system of the riding lawn mower in FIG. 1.
Figure 7:
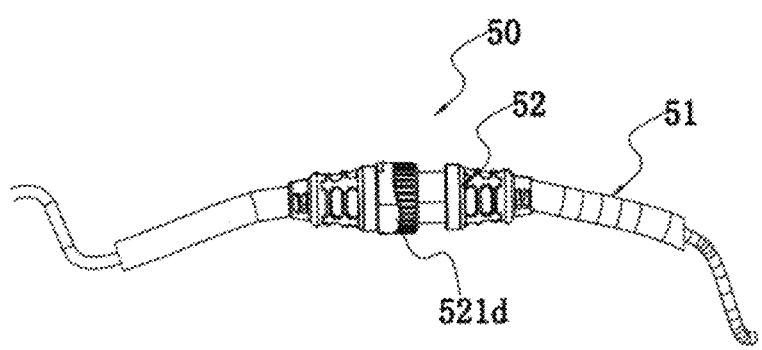
FIG. 7 is a plan view of a connecting wire system in FIG. 6 when the threaded sleeve is in a second position.
Figure 8:
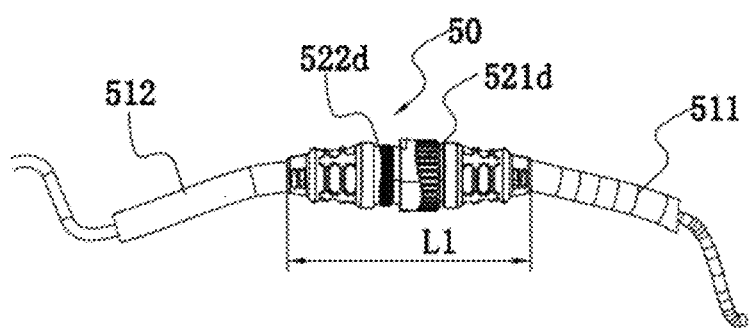
FIG. 8 is a plan view of the connecting wire system in FIG. 6 when the threaded sleeve is in a first position.
Figure 9:
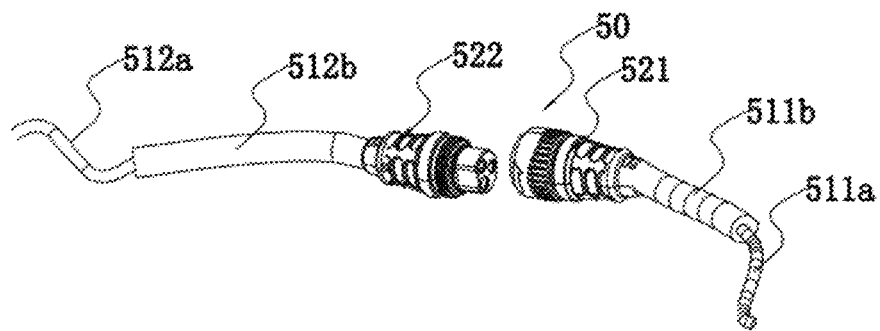
FIG. 9 is a perspective view of the connecting wire system in FIG. 6 when a first terminal and a second terminal are separated.
Figure 10:
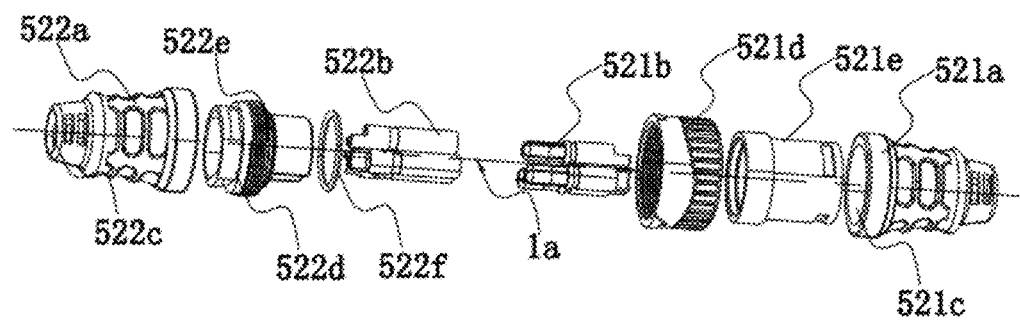
FIG. 10 is an exploded view of a terminal assembly in FIG. 7.
Figure 11:
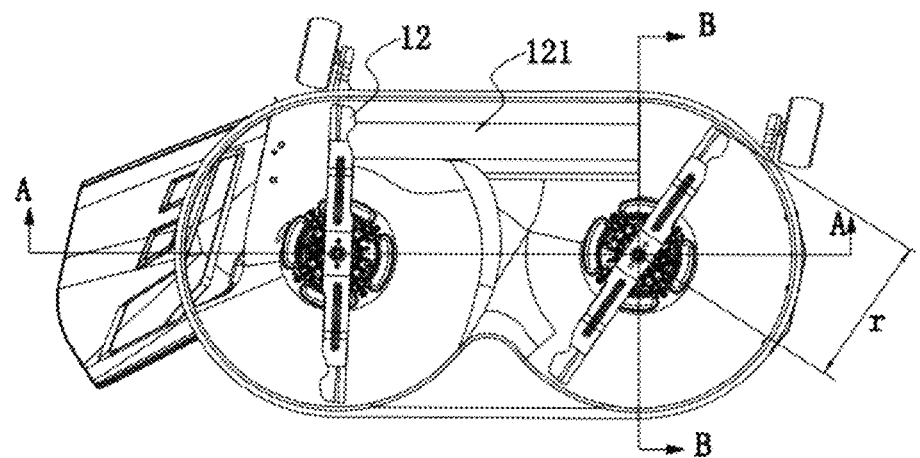
FIG. 11 is a top view of the cutting system in FIG. 7.
Figure 12:
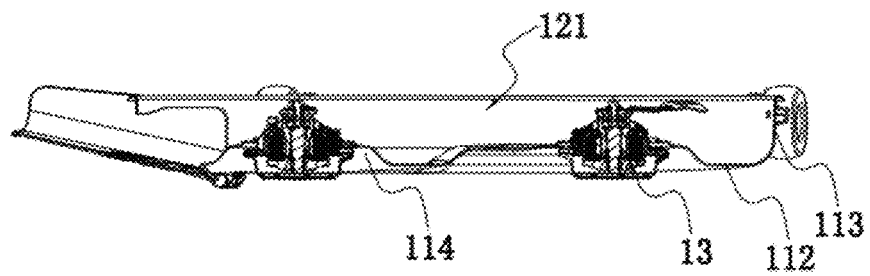
FIG. 12 is a cross-sectional view of the structure shown in FIG. 11 along line AA.
Figure 13:
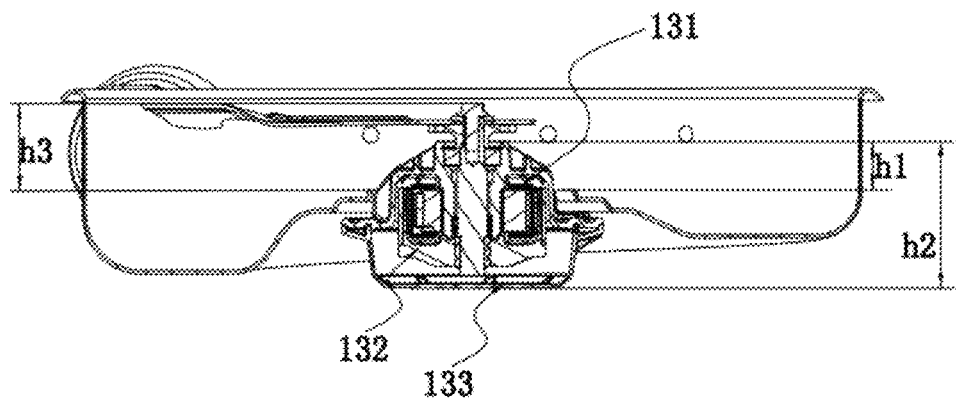
FIG. 13 is a cross-sectional view of the structure shown in FIG. 11 along line BB.
Figure 14:
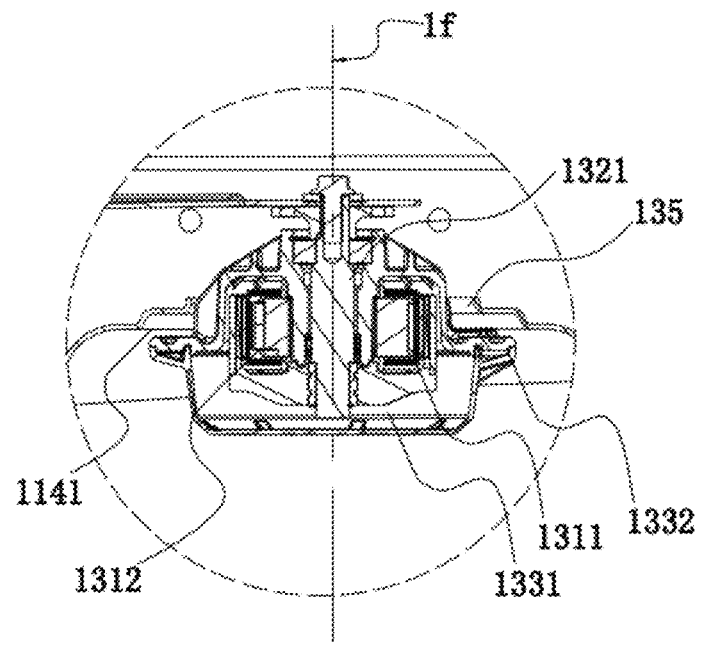
FIG. 14 is a partial enlargement view of the structure in FIG. 13.
Figure 15:
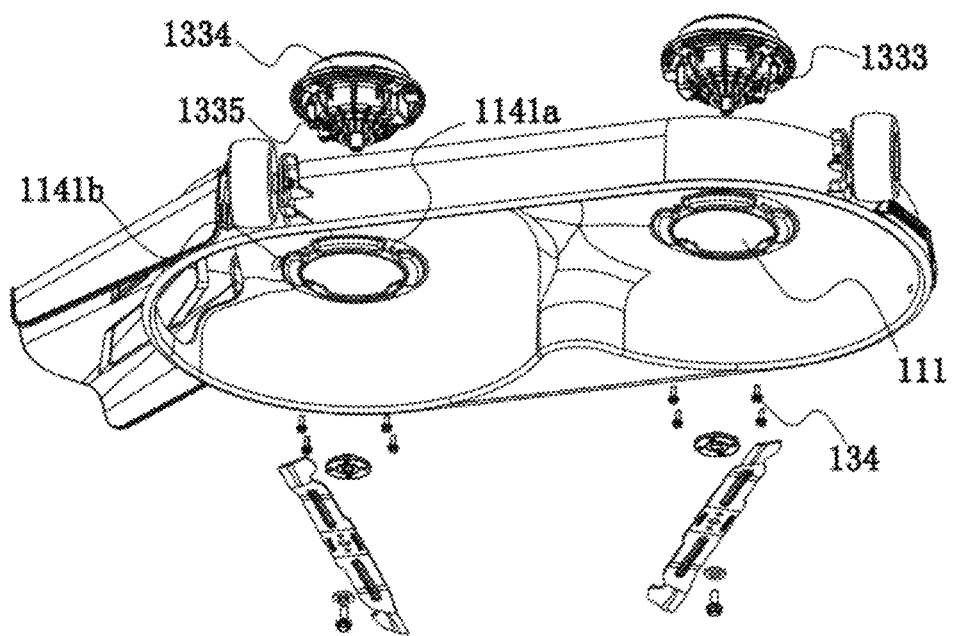
FIG. 15 is an exploded view of the cutting system in FIG. 7.
Figure 16:
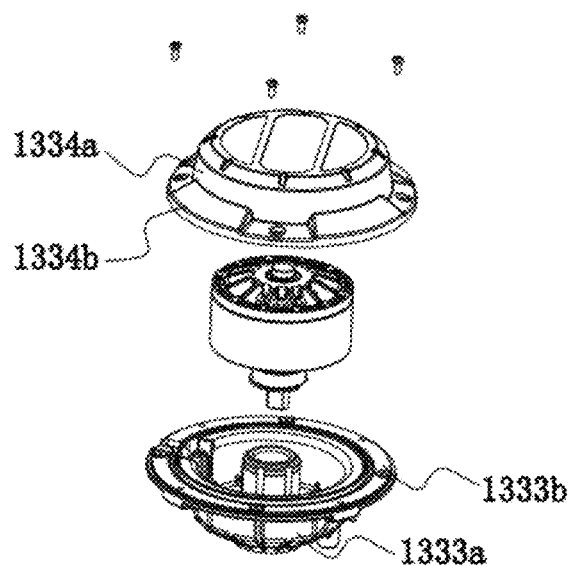
FIG. 16 is an exploded view of a first motor in FIG. 15.

As shown in FIGS. 1 and 5, the riding lawn mower 100 further includes a control module 95. The control module 95 may be arranged under the seat 92, which can save space and make the structure of the whole machine more compact. The control module 95 is used to control electronic devices in each system. For the cutting system 10, the control module 95 can control the operation of the first motor 13. As shown in FIGS. 5 and 6, the cutting system 10 further includes a connecting wire system 50 for connecting the control module 95 and the first motor 13.

As shown in FIGS. 7-10, the connecting wire system 50 includes: a wire assembly 51 and a terminal assembly 52. The wire assembly 51 includes a first connecting wire 511 and a second connecting wire 512. The terminal assembly 52 is disposed between the first connecting wire 511 and the second connecting wire 512 to connect the first connecting wire 511 and the second connecting wire 512. The first connecting wire 511 is connected to the first motor 13, and the second connecting wire 512 is connected to the control module 95. The terminal assembly 52 includes a first terminal 521 and a second terminal 522, the first terminal 521 is fixedly connected to the first connecting wire 511, and the second terminal 522 is fixedly connected to the second connecting wire 512. The first terminal 521 and the second terminal 522 form a detachable connection. The first terminal 521 can be inserted into the second terminal 522, and the first terminal 521 can also be pulled out from the second terminal 522. In this way, when installing the cutting system 10, the cutting system 10 can be treated as a module. The cutting system 10 is assembled first, and then the cutting system 10 is mounted to the frame 91, and finally, the first terminal 521 and the second terminal 522 are connected to realize the electrical connection between the control module 95 and the first motor 13. Alternatively, when the first motor 13 needs to be repaired, the first terminal 521 and the second terminal 522 can be detached to facilitate maintenance.

When the first terminal 521 and the second terminal 522 are connected, the length L1 of the whole formed by the first terminal 521 and the second terminal 522 is greater than or equal to 50 mm and less than or equal to 85 mm. In this way, the size of the terminal assembly 52 can be effectively reduced, so that the production cost can be reduced, and the stability of the connection of the terminal assembly 52 can also be improved.

In some examples, the overall length L1 formed by the first terminal 521 and the second terminal 522 is greater than or equal to 60 mm and less than or equal to 75 mm. In this way, the size of the terminal assembly 52 can be reduced, so that the production cost can be reduced, and the stability of the connection of the terminal assembly 52 can also be improved.

The first terminal 521 includes a first terminal sleeve 521a and a first electrode 521b, and the first connecting wire 511 includes a first conductive core 511a and a first insulating sleeve 511b. The first terminal sleeve 521a surrounds and forms a first accommodation cavity 521c, and the first electrode 521b is disposed in the first accommodation cavity 521c. The first conductive core 511a is connected to the first electrode 521b to transmit electric power, and the first insulating sleeve 511b covers the first conductive core 511a. The first insulating sleeve 511b is fixedly connected to the first terminal sleeve 522a. In some examples, the first insulating sleeve 511b and the first terminal sleeve 522a are injection molded together, so that the first terminal 521 and the first insulating sleeve 511b can realize a more stable connection through a very simple structure, so as to prevent the first terminal 521 and the first insulating sleeve 511b from being separated due to long-time vibration during the operation of the riding lawn mower 100, and reduce the risk of electrical leakage. Similarly, the second terminal 522 includes a second terminal sleeve 522a and a second electrode 522b, and the second connecting wire 512 includes a second conductive core 512a and a second insulating sleeve 512b. The second terminal sleeve 522a surrounds and forms a second accommodation cavity 522c, and the second electrode 522b is disposed in the second accommodation cavity 522c. The second conductive core 512a is connected to the second electrode 522b to transmit electric power, and the second insulating sleeve 512b covers the second conductive core 512a. The second insulating sleeve 512b is fixedly connected to the second terminal sleeve 522a. In some examples, the second insulating sleeve 512b and the second terminal housing 522a are injection molded together, so that the second terminal 522 and the second insulating sleeve 512b can realize a more stable connection through a very simple structure, so as to prevent the second terminal 522 and the second insulating sleeve 512b from being separated due to long-time vibration during the operation of the riding lawn mower 100, and reduce the risk of electrical leakage.

The first terminal 521 further includes a threaded sleeve 521d and a limiting member 521e. The threaded sleeve 521d has internal threads on an inner wall. The threaded sleeve 521d is movably connected to the limiting member 521e along the direction of the center line 1a. The limiting member 521e is used to restrict the threaded sleeve 521d from detaching from the limiting member 521e in the direction of the center line 1a. The second terminal 522 includes an external threaded part 522d, and an outer wall of the external threaded part 522d is formed with external threads that engage with the internal threads. The threaded sleeve 521d can slide between a first position and a second position relative to the limiting member 521e. When the threaded sleeve 521d in the first position, the limiting member 521e protrudes from the threaded sleeve 521d along the direction of the centerline 1a, the limiting member 521e aligns with the threaded sleeve 521d along the direction of the centerline 1a. Of course, the first position here can be understood as the threaded sleeve 521d moving along the centerline 1a to a position closest to the first insulating sleeve 511b, in fact, the threaded sleeve 521d may be movably arranged on the limiting member 521e, the threaded sleeve 521d may also move to a position protruding from the limiting member 521e. When the screw member in the second position, the threaded member protrudes from the limiting member 521e along the direction of the centerline 1a, and move to the external threaded part 522d along the direction of the centerline 1a, and then screw the threaded sleeve 521d so that the threaded sleeve 521d surrounds the external threaded part, therefore, the first terminal 521 and the second terminal 522 are fixedly connected. The structure of the first terminal 521 and the second terminal 522 is simple. The user only needs to insert the second terminal 522 into the first terminal 521, and then screw the threaded sleeve 521*d* to the external threaded part 522*d* to realize the fixed connection of the first terminal 521 and the second terminal 522 and thus facilitate the user's operation, avoid the problem of screwing wrong parts. The threaded sleeve 521*d* moves from the first terminal 521 to the external threaded part 522*d*, so that the overall size L1 of the first terminal 521 and the second terminal 522 is smaller, thereby reducing production cost.

At least one of the first terminal 521 and the second terminal 522 is further provided with a rubber ring 522*f*. When the first terminal 521 and the second terminal 522 are connected, the rubber ring 522*f* contacts the first terminal 521 and the second terminal 522, respectively. Thus, part of the path leading to the first electrode 521*b* and the second electrode 522*b* is sealed at the junction of the first terminal 521 and the second terminal 522, so as to prevent moisture, dust, grass clippings, etc. from entering the inside of the terminal assembly 52, thereby improving the reliability of the terminal assembly 52. In some examples, an annular groove 522*e* is formed on the external threaded part 522*d*, and the rubber ring 522*f* is an O-shaped ring embedded in the annular groove 522*e*. When the first terminal 521 and the second terminal 522 are connected, the threaded sleeve 521*d* is rotated to the external threads, the limiting member 521*e* is inserted into the outer wall of the external threaded part 522*d*, and the rubber ring 522*f* is in contact with the outer wall of the external threaded part 522*d* and the inner wall of the limiting member 521*e*, thereby effectively sealing part of the path leading to the first electrode 521*b* and also sealing part of the path leading to the second electrode 522*b*, thereby preventing moisture, dust, grass clippings, etc. from entering the inside of the terminal assembly 52 to contact the first electrode 521*b* and the second electrode 522*b*.

Of course, it is understandable that the structure of the first terminal 521 and the structure of the second terminal 522 can also be interchanged. In this way, the first terminal 521 forms an external threaded part 522*d*, and the second terminal 522 includes a limiting member 521*e* and a threaded sleeve 521*d*.

In this example, the connecting wire system 50 can also be used to connect the second motor 933 and the control module 95. In this way, the power connection between the second motor 933 and the control module 95 can also be realized through the simple connecting wire system 50. When assembling the riding lawn mower 100, the second motor 933 and the control module 95 may also be installed as separate modules to the frame 91, and then the first terminal 521 and the second terminal in the connecting wire system 50 522 is connected to realize the control of the second motor 933 by the control module 95, thereby facilitating the operation of the user.

As shown in FIGS. 11-16, the first motor 13 includes a stator assembly 131, a rotor assembly 132 and a motor housing 133. The stator assembly 131 includes a stator coil 1311 and a stator core 1312. The rotor assembly 132 includes a rotor shaft 1321 that can rotate about the rotation axis 1*f*. The motor housing 133 surrounds an accommodation cavity 1331 for accommodating the stator assembly 131 and at least part of the rotor assembly 132. The rotor shaft 1321 also passes through the accommodation cavity 1331 in the direction of the rotation axis 1*f* to extend out of the motor housing 133. The motor housing 133 forms the accommodation cavity 1331 for sealing the stator assembly 131 and part of the rotor assembly 132 inside, so as to effectively prevent grass clippings from entering the accommodation cavity 1331 to cause failure of the first motor 13.

In this example, the deck 11 is further formed with a first through hole 111 penetrating through itself along the rotation axis 1*f*, and the first through hole 111 communicates the inside and outside of the mowing space 121. The first motor 13 passes through the first through hole 111 along the direction of the rotation axis 1*f*, so that the first motor 13 is at least partially located inside the mowing space 121. In this way, when the mowing element 12 is driven by the first motor 13 to rotate relative to the deck 11, a cooling airflow is generated in the mowing space 121 so as to cool the part of the first motor 13 in the mowing space 121. At the same time, the cooling airflow also has the function of discharging grass. Because the first through hole 111 communicates the inside and outside of the mowing space 121, when the mowing element 12 rotates, it can also generate a cooling airflow that enters the mowing space 121 through the first through hole 111 from the upper side of the deck 11, and the cooling airflow also flows through the first motor 13 when passing through the first through hole 111, which can help the cooling of the first motor 13, further reducing the temperature rise of the first motor 13 during the working process.

In some examples, the deck 11 includes a top wall 112 and a side wall 113, and the side wall 113 and the top wall 112 jointly surround the mowing space 121 described above. The top wall 112 of the deck 11 is recessed toward the mowing element 12 and forms a groove 114, and the first through hole 111 is provided at the bottom of the groove 114. The motor housing 133 passes through the first through hole 111, so that the motor housing 133 is partially located in the mowing space 121 and partially located outside the mowing space 121. The first through hole 111 is provided at the bottom of the groove 114, thereby effectively reducing the height of the entire deck 11 in the direction of the rotation axis 1*f*, and at the same time, satisfying the size need of the mowing space 121 formed by the deck 11.

The motor housing 133 is further formed with a mounting portion 1332, and the portion of the bottom of the groove 114 surrounding the first through hole 111 forms a supporting portion 1141 for supporting the mounting portion 1332. The mounting portion 1332 is used to cooperate with the supporting portion 1141 to mount the motor housing 133 to the deck 11 so that the first motor 13 and the deck 11 are connected. The size of the mounting portion 1332 in the radial direction perpendicular to the rotation axis if is also greater than the size of the first through hole 111 in this direction, so that the supporting portion 1141 surrounding the first through hole 111 can support the mounting portion 1332, thereby enabling the first motor 13 to be stably installed to the deck 11.

The first motor 13 further includes a fastener 134 for connecting the mounting portion 1332 and the supporting portion 1141 so that the motor housing 133 is fixedly mounted to the deck 11. When the mounting portion 1332 is connected to the supporting portion 1141, an airflow channel 135 communicating with the first through hole 111 is also formed between the mounting portion 1332 and the supporting portion 1141. When the mowing element 12 is driven to rotate by the first motor 13, the airflow channel 135 allows the cooling airflow located outside the mowing space 121 to flow through the airflow channel 135 and the first through hole 111 to enter the inside of the mowing space 121. The cooling airflow can cool the first motor 13 when flowing through the first through hole 111.

In some examples, the motor housing 133 includes: a first housing portion 1333 and a second housing portion 1334, and the first housing portion 1333 and the second housing portion 1334 are connected together to form the aforementioned accommodation cavity 1331. The first housing portion 1333 is formed with a second through hole 1335 for the rotor shaft 1321 to pass through in the direction of the rotation axis 1f. The first housing portion 1333 may include: a first cylindrical portion 1333a and a first flange portion 1333b, the first cylindrical portion 1333a surrounds the rotation axis 1f, and the first flange portion 1333b extends outward from the first cylindrical portion 1333a in the radial direction. The second housing portion 1334 includes: a second cylindrical portion 1334a and a second flange portion 1334b. The second cylindrical portion 1334a surrounds the rotation axis 1f. The second flange portion 1334b extends from the second cylindrical portion 1334a in the radial direction. The first flange portion 1333b and the second flange portion 1334b can be regarded as the mounting portion 1332 of the motor housing 133. The first cylindrical portion 1333a and the second cylindrical portion 1334a may have substantially the same diameter, the first through hole 111 is a circular hole, and the diameter of the first through hole 111 is larger than that of the first cylindrical portion 1333a and the second cylindrical portion 1334a. The first flange portion 1333b is annular, and the maximum dimension of the first flange portion 1333b in the direction perpendicular to the rotation axis if is larger than the maximum dimension of the first through hole 111 in this direction. In some examples, the first flange portion 1333b is supported by the supporting portion 1141 on the side of the deck 11 away from the mowing space 121, and the portion of the motor housing 133 located on the lower side of the first flange portion 1333b passes through the first through hole 111, which allows the first motor 13 to at least partially extend into the mowing space 121. The supporting portion 1141 also includes a fitting portion 1141a and a recess 1141b. The fitting portion 1141a is attached to the first flange portion 1333b. The recess 1141b and the first flange portion 1333b are spaced apart in a direction parallel to the rotation axis if to form the above-mentioned airflow channel 135. The fastener 134 passes through the fitting portion 1141a, the first flange portion 1333b, and the second flange portion 1334b of the supporting portion 1141 in the direction of the rotation axis 1f. Thus, the fastener 134 can fix the first motor 13 to the deck 11 while fixing the first housing portion 1333 and the second housing portion 1334 together.

In the present example, the ratio of the dimension h1 of the portion of the motor housing 133 in the mowing space 121 in the direction along the rotation axis if to the dimension h2 of the motor housing 133 in the direction along the rotation axis if is greater than or equal to 0.3 and less than or equal to 1. The ratio of the dimension h3 of the portion of the first motor 13 located in the mowing space 121 in the direction of the rotation axis if to the maximum cutting radius r of the mowing element 12 is greater than or equal to 0.1 and less than or equal to 0.8, so that the size of the part of the first motor 13 located in the mowing space 121 is the largest, thereby improving the cooling performance of the first motor 13.

The frame 91 includes longitudinal beams and lateral beams. In some examples, the frame 91 includes two longitudinal beams, respectively, a first longitudinal beam 911 and a second longitudinal beam 912, and the frame 91 also includes two lateral beams, respectively, a first lateral beam 913 and a second lateral beam 914. The first longitudinal beam 911 is provided on the left side of the seat 92, and the second longitudinal beam 912 is provided on the right side of the seat 92. The first longitudinal beam 911 extends along a first line 1b, and the second longitudinal beam 912 extends along a second line 1c. Both the first line 1b and the second line 1c are defined as a longitudinal line 1d, and the longitudinal line 1d extends in the front and rear direction. In this example, the extending directions of the first longitudinal beam 911 and the second longitudinal beam 912 are parallel to each other. The first lateral beam 913 is arranged on the front side of the seat 92, and the first lateral beam 913 is basically located at the front end of the riding lawn mower 100. In this way, the first lateral beam 913 also serves as a front bumper to protect the front end of the riding lawn mower 100 from damage. The second lateral beam 914 is provided in the rear side of the seat 92. The second lateral beam 914 is basically located at the rear end of the riding lawn mower 100. In this way, the second lateral beam 914 also serves as a rear bumper to protect the rear end of the riding lawn mower 100 from damage. At least part of the first lateral beam 913 and the second lateral beam 914 extend along the lateral line 1e, and the lateral line 1e extends along the left and right direction. In this example, the extension directions of the first lateral beam 913 and the second lateral beam 914 are parallel to each other, and the lateral line 1e and the longitudinal line 1d are perpendicular to each other.

The housing system 20 includes a left housing assembly 21 and a right housing assembly 22, the left housing assembly 21 is arranged on the left side of the seat 92, and the right housing assembly 22 is arranged on the right side of the seat 92. The left housing assembly 21 is mounted to the first longitudinal beam 911 on the left side of the seat 92 and connected with the first longitudinal beam 911, and the right housing assembly 22 is mounted to the second longitudinal beam 912 on the right side of the seat 92 and connected with the second longitudinal beam 912.

Figure 17:
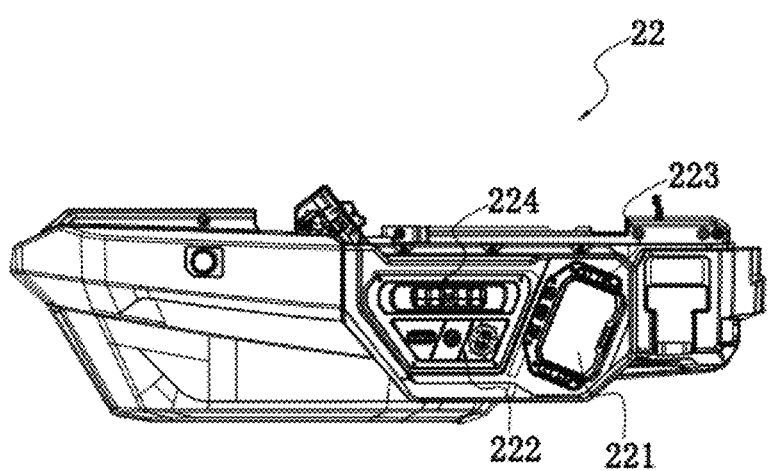
FIG. 17 is a plan view of a right housing assembly in FIG. 1.

As shown in FIG. 17, the right housing assembly 22 is also provided with a display screen 221, a switch assembly 222, and a plurality of operating buttons 223. The right housing assembly 22 is also provided with a first storage box 224 for storing objects. The left housing assembly 21 is provided with a second storage box 211 for storing objects. In this way, storage boxes are provided on both sides of the seat 92, which is convenient for left-handed users and right-handed users, and also increases the storage space, which is convenient for users to work. The display screen 221 and the switch assembly 222 are arranged on the right housing assembly 22, so that the user can conveniently see the display status on the right display 221 while operating the switch assembly 222, and set them on the right side of the seat 92 is more in line with the ergonomic design.

In some examples, the display screen 221 includes a display interface 2211 for displaying the working status of the riding lawn mower 100, and the display interface 2211 is understood as a display area directly observable by the user. The switch assembly 222 is used for user operation. The switch assembly 222 has multiple operation modes. When the user uses a first operation mode to operate the switch assembly 222, the display interface 2211 on the display screen 221 can be awakened so that the display screen 221 enters the startup interface from the black screen interface when the power is off. When the display interface 2211 enters the startup interface, the working status of the riding lawn mower 100 and other status information can be displayed on the display interface 2211. At this time, the user can make the riding lawn mower 100 operate by operating other operating elements or buttons. The lawn mower 100 enters a walking state or a mowing state.

In this example, the plane passing through the first line 1*b* and the second line 1*c* is defined as the reference plane 1*g*. If the riding lawn mower 100 walks on the ground parallel to the horizontal plane, the reference plane 1*g* and the horizontal plane are parallel to each other. As shown in FIGS. 17-21, the display interface 2211 extends in an inclined plane 1*h* that obliquely intersects with the reference plane 1*g*. The angle formed by the oblique intersection between the inclined plane 1*h* extending the display screen 221 and the reference plane 1*g* is greater than or equal to 2 degrees and less than or equal to 30 degrees. Therefore, the display interface 2211 extends upwards obliquely, thereby facilitating the user to observe the status information on the display screen 221 while sitting on the seat 92, without looking down at the status information.

Different status information can be displayed on the display interface 2211 as required. The display interface 2211 can display the walking speed of the walking system 93, the rotational speed of the mowing element 12, the energy efficiency status of the riding lawn mower 100, the remaining capacity information of the power supply device 94, warning information, fault information, and the remaining operating time of the power supply device 94, etc. In this example, a mode button 225 is also provided around the display interface 2211. The mode button 225 is operated by the user to make the riding lawn mower 100 enter different working modes, such as a comfortable mode, a normal mode and an extreme mode, in this way, the user can choose different working modes according to personal preferences, thereby improving user experience of the riding lawn mower 100. Similarly, information about different working modes of the riding lawn mower 100 can also be displayed on the display interface 2211.

The status information on the display interface 2211 can be conveniently checked by the user, and the size of the display interface 2211 can be understood as a display area exposed to be observed by the user. In this example, the display interface 2211 is substantially rectangular, the size L2 of the display interface 2211 in the length direction is greater than or equal to 100 mm and less than or equal to 150 mm, and the size L3 of the display interface 2211 in the width direction is greater than or equal to 60 mm and less than or equal to 90 mm. In this way, the size of the display interface 2211 is large enough to display more status information that the user wants to know. The area of the display interface 2211 is greater than or equal to 70 square centimeters and less than or equal to 110 square centimeters.

As described above, when the switch assembly 222 is operated by the user in the first operation mode, the display interface 2211 enters the startup interface, then the display interface 2211 displays a variety of status information. The display interface 2211 can not only display the remaining capacity information of the power supply device 94, but also display status information of the riding lawn mower 100. At the same time, the riding lawn mower 100 is started to enter a pre-working state before walking or mowing. When the switch assembly 222 is operated by the user in the second operation mode, the display interface 2211 enters the lighting interface. At this time, the display interface 2211 only displays the remaining capacity information of the power supply device 94. In this way, the user only needs to perform simple operations to get the remaining capacity information of the power supply device 94 to determine whether charging is needed. The user does not need to start the riding lawn mower 100 to get the remaining capacity information of the power supply device 94, thereby facilitating user's operation.

The switch assembly 222 includes a key 2221, a power key 2222, and a start key 2223. The start key 2223 is used to start the first motor 13 for mowing. The right housing assembly 22 is also provided with a key hole 2224 into which the key 2221 is inserted. When the key 2221 is inserted into the key hole 2224, the switch located in the key hole 2224 can be activated, that is, when the key 2221 is inserted into the key hole 2224, the switch located in the key hole 2224 can be activated without rotating the key 2221, thereby facilitating user's operation. A safety cover 2225 is also connected to the key hole 2224, and the safety cover 2225 is movably connected to the key hole 2224. When the key 2221 is not inserted into the key hole 2224, the safety cover 2225 seals the key hole 2224 to prevent moisture, dust, etc. from entering the key hole 2224. When the key 2221 is inserted into the key hole 2224, the safety switch is pressed down to make the keyhole 2224 open. The safety cover 2225 is rotatably connected to the right housing assembly 22 through a torsion spring.

Figure 22:
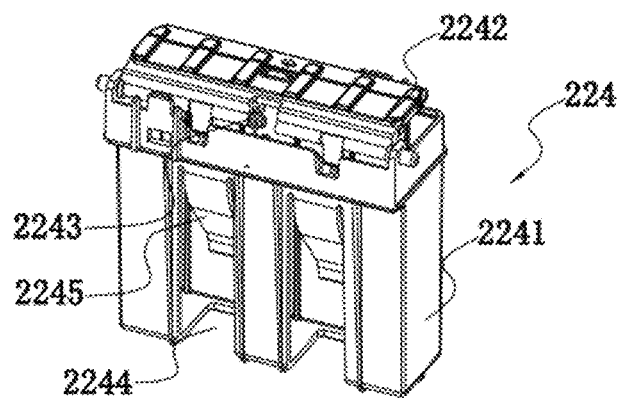
FIG. 22 is a perspective view of a first storage box in FIG. 18.

The first storage box 224 located on the right side of the seat 92 is a mobile phone box for storing mobile phones. As shown in FIG. 22, the first storage box 224 includes a box body 2241 and a box cover 2242. The box body 2241 surrounds and forms an accommodation space 2244 for storing mobile phones, and the box cover 2242 is rotatably connected to the box body 2241. The first storage box 224 further includes a biasing element 2243 for biasing the box cover 2242 to the position where the box body 2241 is closed. When the mobile phone is inserted into the box body 2241, the mobile phone presses the box cover 2242 down to make the box body 2241 open. The biasing element 2243 may be a torsion spring connected between the box body 2241 and the box cover 2242. In this way, when the mobile phone is not inserted, the box cover 2242 closes the accommodation space 2244, which can effectively prevent dust and grass clippings from entering the first storage box 224. The box body 2241 is also provided with an elastic member 2245 for supporting the mobile phone. When the mobile phone is inserted into the box 2241, the elastic member 2245 presses the mobile phone so that the mobile phone is stably supported in the box 2241, thereby avoiding damages to the mobile phone due to vibrations during the walking process of the riding lawn mower 100. The elastic member 2245 may be a flat spring protruding from the side wall of the box body 2241, which is integrally formed with the box body 2241. The flat spring extends from one side wall of the box body 2241 to the other side wall, and the mobile phone is supported between the flat spring and the other side wall to prevent the mobile phone from shaking.

Figure 4:
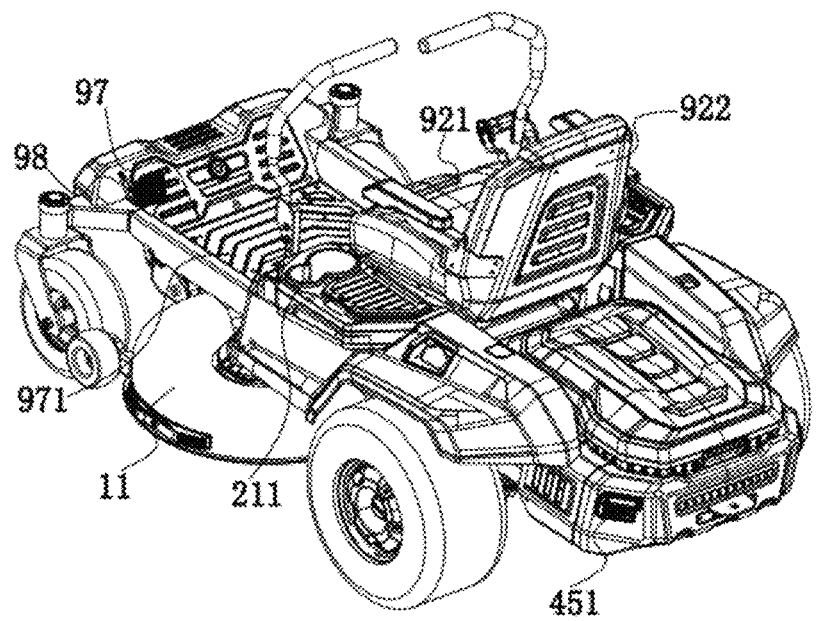
FIG. 4 is a perspective view of the riding lawn mower in FIG. 1 with a grass catcher system removed.
Figure 23:
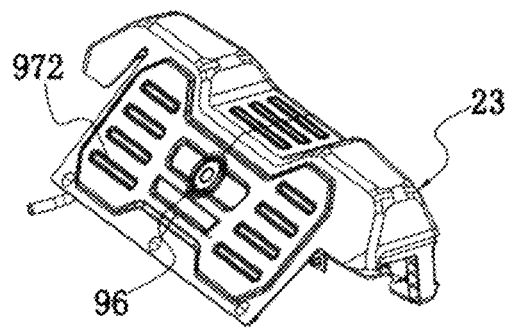
FIG. 23 is a perspective view of a front housing assembly and a front lighting assembly in FIG. 1.

As shown in FIGS. 4, 5, and 23, the riding lawn mower 100 further includes a battery charge indicator device 96 for displaying the remaining capacity of the power supply device 94. In other words, in addition to displaying the remaining capacity of the power supply device 94 on the display interface 2211, the riding lawn mower 100 also includes a battery charge indicator device 96 that can display the remaining capacity. The riding lawn mower 100 further includes a footrest 97 provided on the front side of the seat 92; the footrest 97 is used to support the user's feet. The footrest 97 is connected to a lateral beam or a longitudinal beam. The footrest 97 includes a bottom plate 971 and a front cover 972, wherein the bottom plate 971 is connected to the first longitudinal beam 911 and the second longitudinal beam 912, and the front cover 972 is connected to the first lateral beam 913. The front cover 972 can be used as a part of the front housing assembly 23 in the housing system 20.

The battery charge indicator device 96 is installed on the footrest 97 and is located on the front side of the seat 92, so that when the user rides on the seat 92, the user can easily observe the battery charge indicator device 96 located on the front side. Thereby, it is convenient to get the remaining capacity of the power supply device 94, so the user does not need to turn his head and look to the display screen 221 on the right to get the remaining capacity information of the power supply device 94.

Figure 24:
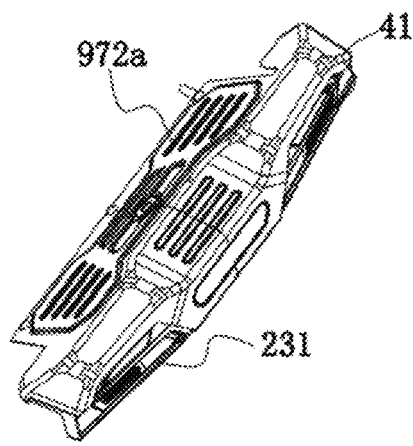
FIG. 24 is another perspective view of the front housing assembly and the front lighting assembly in FIG. 1.
Figure 25:
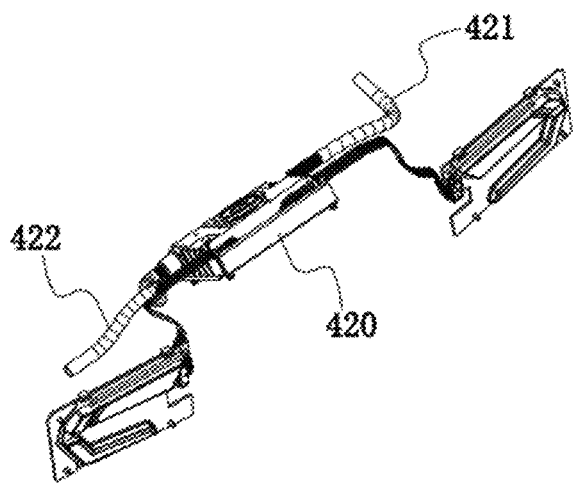
FIG. 25 is a perspective view of the structure shown in FIG. 24 with the front housing assembly removed.
Figure 26:
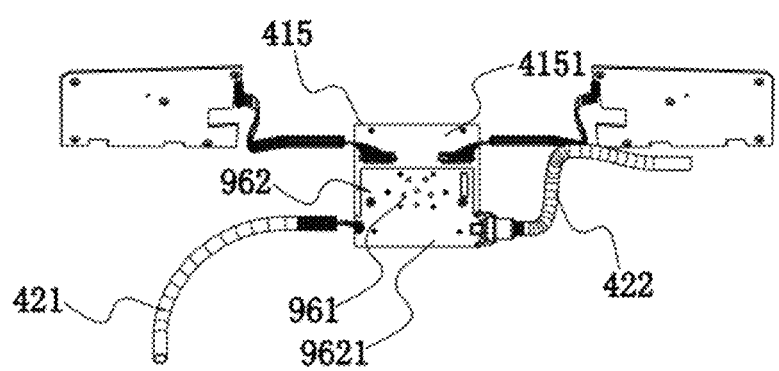
FIG. 26 is a plan view of the structure shown in FIG. 24 with a circuit board box removed.
Figure 27:
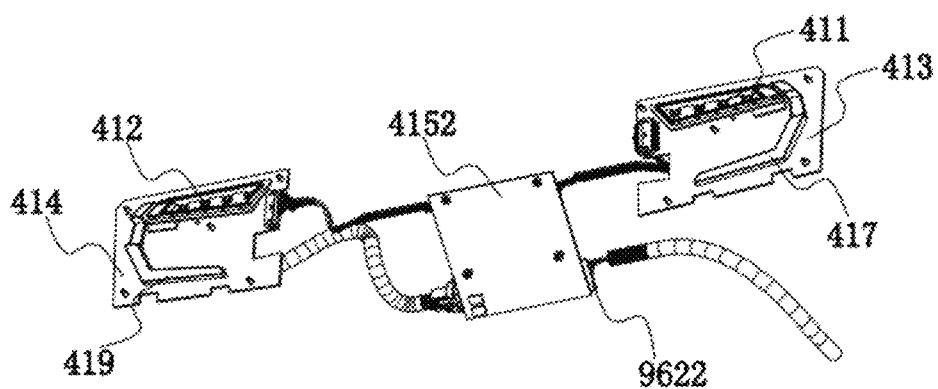
FIG. 27 is a perspective view of the structure shown in FIG. 24 showing a first light and a second light.
Figure 28:
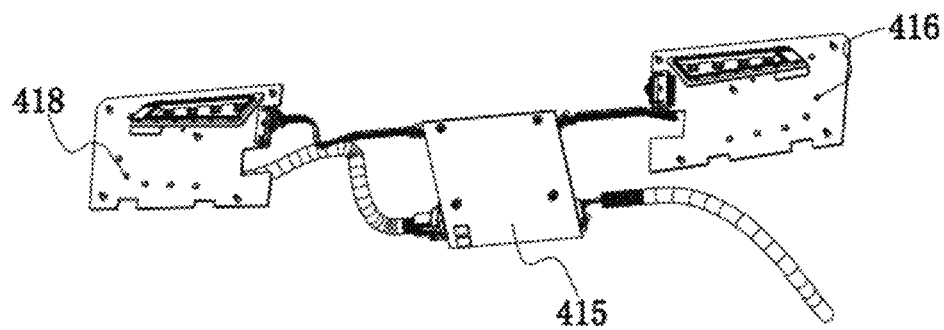
FIG. 28 is a perspective view of the structure shown in FIG. 27 with a first light guide plate and a second light guide plate removed.

As shown in FIGS. 24-26, the battery charge indicator device 96 includes a battery charge indicator light 961. The battery charge indicator device 96 is arranged between the two front walking wheels 931, the battery charge indicator light 961 is arranged between the first longitudinal beam 911 and the second longitudinal beam 912. The distance from the battery charge indicator light 961 to the first longitudinal beam 911 is basically the same as the distance to the second longitudinal beam 912. In this way, the battery charge indicator light 961 is located in front of the seat 92, which is convenient for the user to observe.

The bottom plate 971 is formed with a bottom plane 971a for supporting the user's feet, and the bottom plane 971a extends in a first plane. In this example, the first plane and the aforementioned reference plane 1g are parallel to each other. The front cover 972 is formed with a front plane 972a for obliquely supporting the user's feet. The front plane 972a extends in a second plane, and the second plane obliquely intersects the first plane to form an obtuse angle open toward the user, and the obtuse angle is greater than or equal to 120 degrees and less than or equal to 150 degrees, so that the user's foot can be obliquely supported on the front cover 972, thereby improving the user's comfort and reducing the user's fatigue caused by sitting for a long time. The battery charge indicator device 96 is installed on the front cover 972. Thus, on the one hand, it is convenient to install a battery charge indicator circuit board 962 under the front cover 972 for controlling the battery charge indicator light 961, on the other hand, it is convenient for the user to observe the display status of the battery charge indicator device 96.

A front lighting assembly 41 is also installed on the front cover 972, and the front lighting assembly 41 is configured to emit light toward the front side area of the riding lawn mower 100. In some examples, the battery charge indicator light 961 emits light toward the seat 92, so that when the user sits on the seat 92, the user's eyes fall into the light-emitting area of the battery charge indicator light 961, thereby facilitating the user to observe the battery charge indicator 96. In the front and rear direction, the distance between the battery charge indicator light 961 and the seat 92 is greater than or equal to 300 mm and less than or equal to 1000 mm, so as to prevent the battery charge indicator light 961 from being too close to the seat 92, in which case the user needs to lower the head to observe the display state of the battery charge indicator device 96, and to prevent the battery charge indicator light 961 from being too far away from the seat 92, in which case the user has difficulties to clearly observe the display state of the battery charge indicator 96.

The riding lawn mower 100 further includes: a brake assembly 98, the brake assembly 98 includes a pedal 981 for the user to step on to brake or park the riding lawn mower 100, and the battery charge indicator light 961 is arranged in the front side of the pedal 981, so that the distance between the battery charge indicator light 961 and the seat 92 is more reasonable.

The lighting system 40 includes the above-mentioned front lighting assembly 41, and the front lighting assembly 41 is arranged on the front side of the seat 92.

As shown in FIGS. 23-28, the front lighting assembly 41 includes: a first light 411, a second light 412, a first circuit board 413 and a second circuit board 414. The first circuit board 413 supports the first light 411. The second circuit board 414 supports the second light 412. The front housing assembly 23 also includes a mounting bracket 231 for mounting the front lighting assembly 41, and the front cover 972 covers the upper side of the mounting bracket 231. The first light 411 and the first circuit board 413 are arranged on the left side of the front housing assembly 23, and the second light 412 and the second circuit board 414 are arranged on the right side of the front housing assembly 23. The first light 411 and the second light 412 emit light toward the front of the riding lawn mower 100, thereby illuminating the area in front of the riding lawn mower 100. The front lighting assembly 41 further includes a control circuit board 415. The control circuit board 415 is electrically connected to the first circuit board 413 to control the first light 411, and the control circuit board 415 is also electrically connected to the second circuit board 414 to control the second light 412. The control circuit board 415 is arranged between the first light 411 and the second light 412, the first light 411 and the second light 412 are arranged on both sides of the front housing assembly 23, and the control circuit board 415 is arranged at the middle area of the front housing assembly 23, thus, the control circuit board 415 is also arranged between the first circuit board 413 and the second circuit board 414. The first circuit board 413 is connected to the control circuit board 415 through wires, and the second circuit board 414 is connected to the control circuit board 415 through wires. The control circuit board 415 is also installed on the mounting bracket 231 and located on the lower side of the front cover 972, that is, the control circuit board 415 is arranged in the space surrounded by the front cover 972 and the mounting bracket 231. The control circuit board 415 has a first upper surface 4151 and a first lower surface 4152. Electronic components are mounted on the first upper surface 4151 or the first lower surface 4152. The area of the first upper surface 4151 of the control circuit board 415 is greater than or equal to 60 square centimeters and less than or equal to 130 square centimeters. Thus, the surface area of the control circuit board 415 is large enough to facilitate the cooling of the electronic component on the control circuit board 415. There is no need to additionally provide a cooling channel for the control circuit board 415 on the front housing assembly 23, thereby effectively preventing dust, moisture, etc. from entering the control circuit board 415, thereby improving the stability and usability of the control circuit board 415. Of course, the surface area of the control circuit board 415 should not be too large, so as to avoid the problem that there is not enough space on the front housing assembly 23 to install the control circuit board 415, thereby making the structure of the front housing assembly 23 simpler and more compact. In some examples, in order to better control the front lighting assembly 41, the area of the first upper surface 4151 of the control circuit board 415 is greater than or equal to 80 square centimeters and less than or equal to 120 square centimeters.

The first light 411 is a first LED light mounted on the first circuit board 413, and the luminous power of the first LED light is greater than or equal to 1.5 W. In some examples, the luminous power of the first LED light is greater than or equal to 2 W, so that the luminous power of the first light 411 is relatively large in order to improve the brightness of the first light 411. Because the luminous power of the first light 411 is relatively large, the first light 411 generates a large amount of heat during the lighting process. Therefore, the first circuit board 413 is an aluminum substrate board, which achieves better cooling effect for the first light 411. The second light 412 is a second LED light installed on the second circuit board 414, and the luminous power of the second LED light is greater than or equal to 1.5 W. In some examples, the luminous power of the second LED light is greater than or equal to 2 W, so that the luminous power of the second light 412 is relatively large in order to improve the brightness of the second light 412. Because the luminous power of the second light 412 is relatively large, the second light 412 will generate a lot of heat during the lighting process. Therefore, the second circuit board 414 is an aluminum substrate board, which achieves better cooling effect for the second light 412.

The front lighting assembly 41 also includes: a first surface light source assembly and a second surface light source assembly. The first surface light source assembly includes a third light 416 and a first light guide plate 417. The second surface light source assembly includes a fourth light 418 and a second light guide plate 419. The third light 416 is mounted on the first circuit board 413, and the first light guide plate 417 is used to guide the light from the third light 416 to emit in the form of floodlight. In this way, the light emitted by the first surface light source assembly will be more soft and uniform. The fourth light 418 is installed on the second circuit board 414, and the second light guide plate 419 is used to guide the light from the fourth light 418 to emit in the form of floodlight, so that the light emitted by the second surface light source assembly will be more soft and uniform.

In this example, the mounting bracket 231 is a plastic part, which can easily form the mounting structure of the front lighting assembly 41. The front cover 972 is a metal part, on the one hand, to facilitate cooling of the front lighting assembly 41, and on the other hand, to increase the strength of the front housing assembly 23. In the front and rear direction, the front cover 972 also protrudes forward from the mounting bracket 231, that is, the front lighting assembly 41 is recessed relative to the front cover 972, and the front cover 972 is relatively strong. In this way, the front cover 972 can protect the mounting bracket 231 and the front lighting assembly 41 from damage and improve the service life of the front lighting assembly 41.

As described above, the battery charge indicator device 96 is also installed to the front cover 972. The battery charge indicator light 961 is also arranged between the first light 411 and the second light 412. To ease control, the battery charge indicator circuit board 962 is disposed close to the control circuit board 415. In this example, a circuit board box 420 is further provided in the front housing assembly 23, and the circuit board box 420 is formed with an accommodation cavity. The control circuit board 415 and the battery charge indicator circuit board 962 are both arranged inside the circuit board box 420. On the one hand, it protects the battery charge indicator circuit board 962 and the control circuit board 415, and on the other hand, it helps the installation of the control circuit board 415 and the battery charge indicator circuit board 962. The control circuit board 415 and the battery charge indicator circuit board 962 form an electrical connection, so that the control circuit board 415, the battery charge indicator circuit board 962 and the circuit board box 420 form a whole that is integrally movable, and the whole can output signals to other electric equipment. The battery charge indicator circuit board has a second upper surface 9621 and a second lower surface 9622.

The second upper surface 9621 is installed with electronic components. The area of the second upper surface 9621 of the battery charge indicator circuit board 962 is greater than or equal to 45 square centimeters and less than or equal to 75 square centimeters, so that the surface area of the battery charge indicator circuit board 962 is large enough to improve the cooling of the battery charge indicator circuit board. In this way, the battery charge indicator device 96 and the front lighting assembly 41 can be controlled through the battery charge indicator circuit board 962 and the control circuit board 415.

Figure 29:
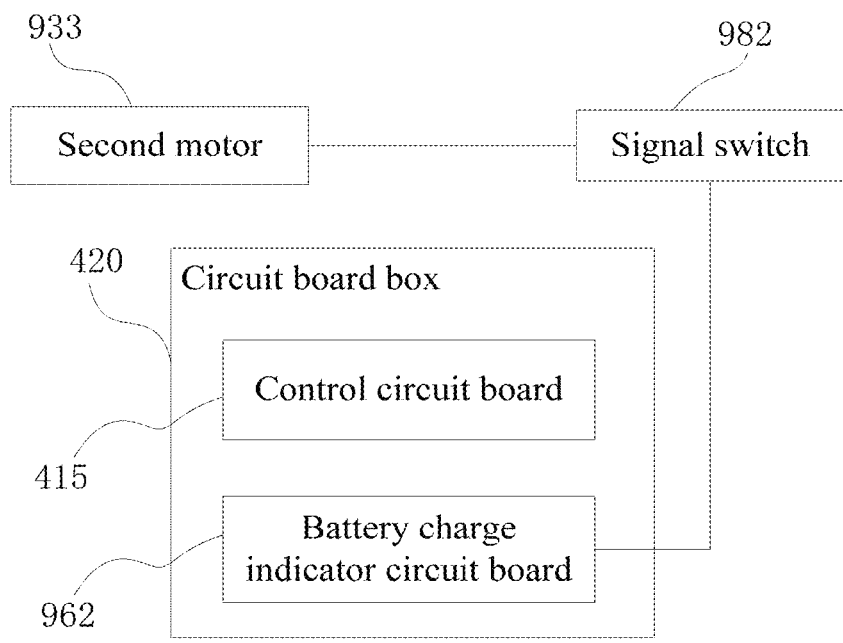
FIG. 29 is a circuit connection diagram of the circuit board box and the second motor.

As shown in FIGS. 1 and 29, the brake assembly 98 further includes a signal switch 982 for controlling the second motor 933. The brake assembly 98 has a braking mode and a parking mode. When the brake assembly 98 enters the braking mode, the signal switch 982 is not triggered, and when the brake assembly 98 enters the parking mode, the signal switch 982 is triggered. The signal switch 982 can turn off the second motor 933 when triggered, so that the walking system 93 can quickly stop walking. The signal switch 982 is provided under the pedal 981 and also under the bottom plate 971. The signal switch 982 is also located on the left side of the riding lawn mower 100. In order to electrically connect the signal switch 982 and the second motor 933, a first wire 421 connected to the signal switch 982 is also provided. One end of the first wire 421 is connected to the signal switch 982, and the other end of the first wire 421 extends into the circuit board box 420. In some examples, the first wire 421 is electrically connected to the battery charge indicator circuit board 962, and the first wire 421 is led out at the signal switch 982, and then through the left side of the riding lawn mower 100, and then through the front side of the riding lawn mower 100, and finally into the circuit board box 420. The circuit board box 420 also leads out a second wire 422. One end of the second wire 422 is electrically connected to the battery charge indicator circuit board 962, and the other end is connected to the control module 95. The connection between the second wire 422 and the control module 95 may be a direct connection or an indirect connection. The second wire 422 may also be a bus directly connected to the control module 95. The second wire 422 is led out from the circuit board box 420, and then through the front side of the riding lawn mower 100, and then through the left side of the riding lawn mower 100, and finally into the control module 95. In this way, multiple systems can be controlled with a simple wiring structure, which reduces costs and simplifies the structure.

Figure 2:
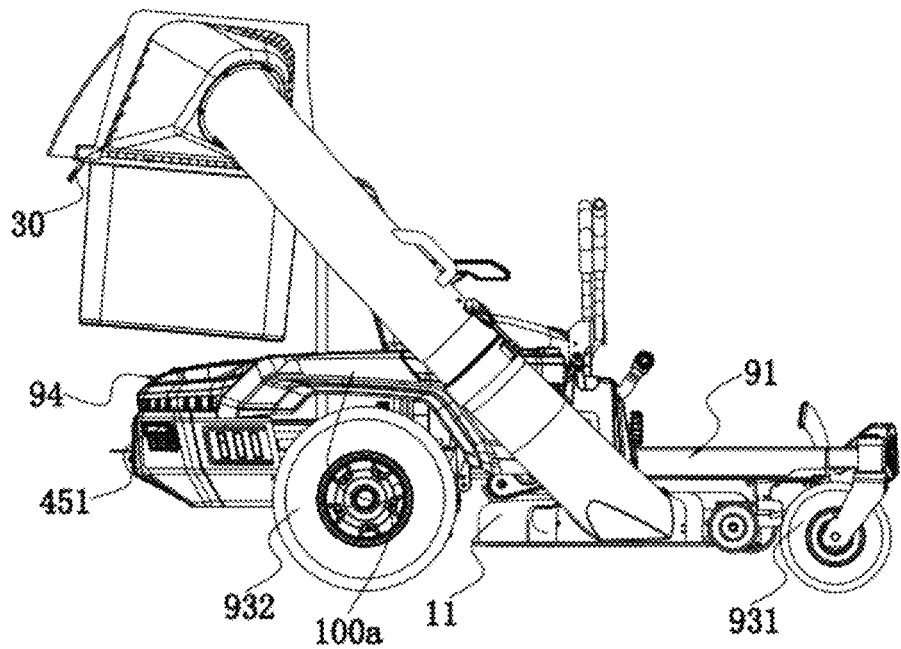
FIG. 2 is a plan view of the riding lawn mower in FIG. 1.
Figure 18:
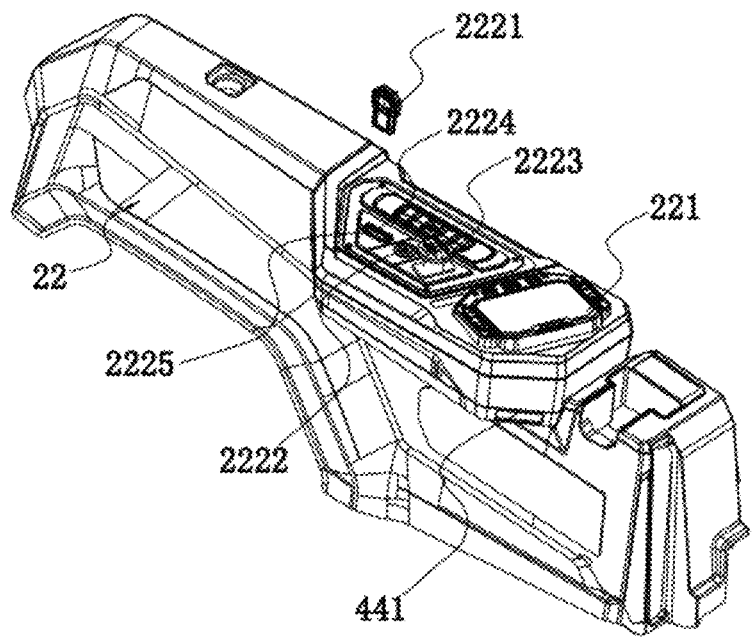
FIG. 18 is a perspective view of the right housing assembly in FIG. 1.
Figure 19:
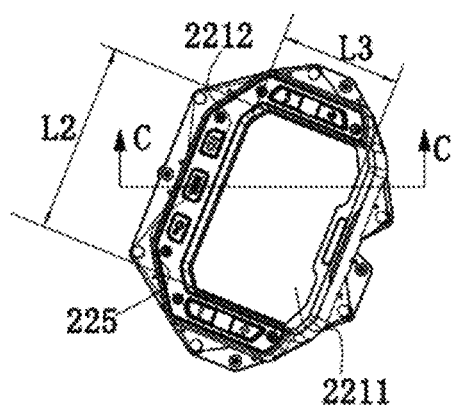
FIG. 19 is a plan view of a display screen and operating buttons in FIG. 18.
Figure 20:
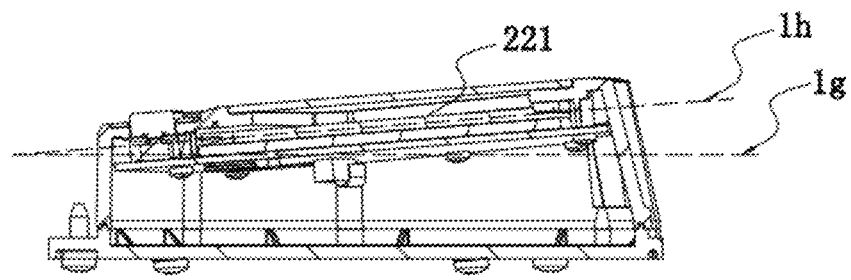
FIG. 20 is a cross-sectional view of the structure shown in FIG. 19 along line CC.
Figure 21:
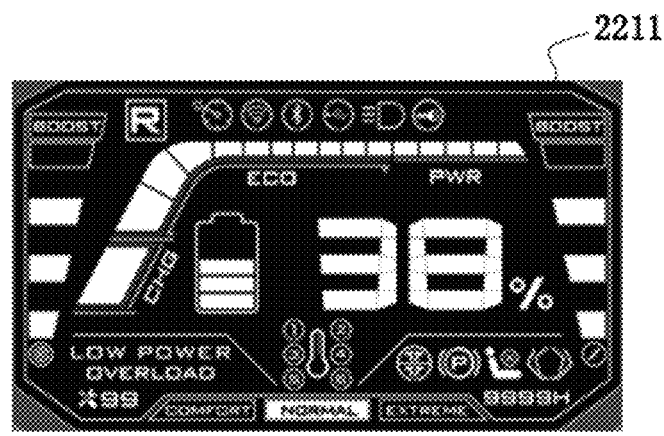
FIG. 21 is a plan view of the display interface in FIG. 19.
Figure 30:
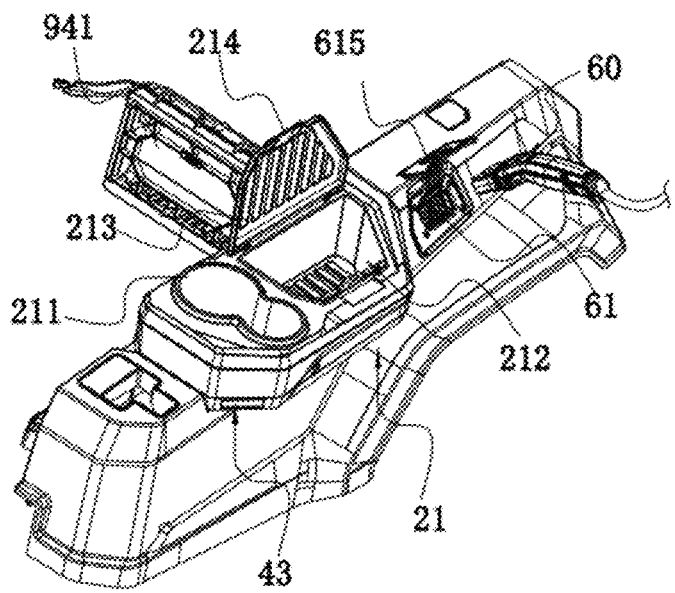
FIG. 30 is a perspective view of a left housing assembly and a power supply management module in FIG. 1.
Figure 31:
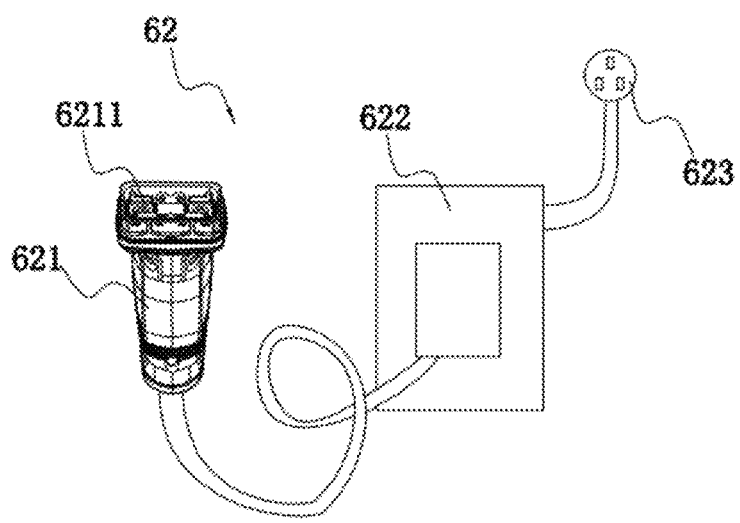
FIG. 31 is a plan view of a charging assembly in FIG. 30.
Figure 32:
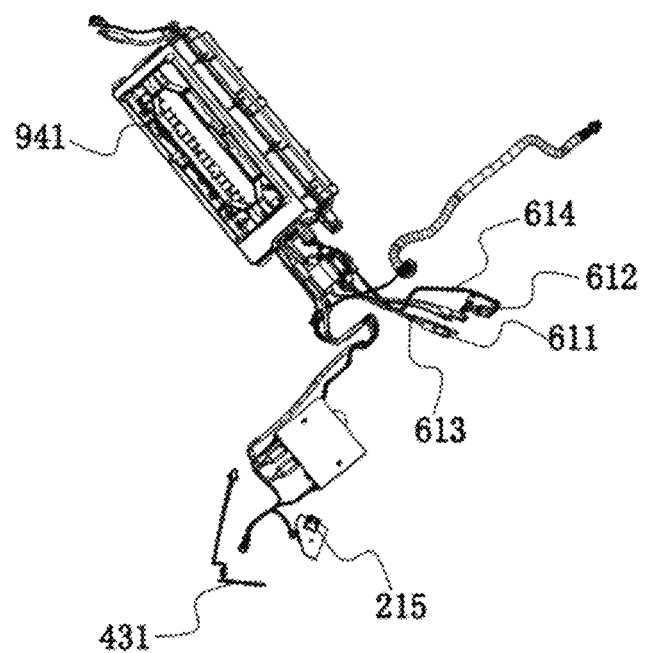
FIG. 32 is a perspective view of the structure shown in FIG. 30 with the left housing assembly removed.

As shown in FIGS. 1, 18, and 30, the lighting system 40 further includes: a left lighting assembly 43 and a right lighting assembly 44. As shown in FIGS. 1-3, the lighting system 40 further includes: a rear lighting assembly 45. The left lighting assembly 43 is arranged on the left side of the seat 92, the right lighting assembly 44 is arranged on the right side of the seat 92, and the rear lighting assembly 45 is arranged on the rear side of the seat 92. As shown in FIGS. 30 and 32, the left lighting assembly 43 is mounted on the left housing assembly 21, and the left lighting assembly 43 includes a left light 431. The right lighting assembly 44 is mounted on the right housing assembly 22, and the right lighting assembly 44 includes a right light 441. In this way, the left lighting assembly 43 and the right lighting assembly 44 can be used as outline lights of the riding lawn mower 100, thereby facilitating other people around to observe the outline of the riding lawn mower 100.

The left light 431 emits light obliquely downward, and the right light 441 emits light obliquely downward, so that the working area on the left and right sides of the riding lawn mower 100 can be illuminated. The left light 431 can also project light to the lower left side, so as to illuminate the left side of the deck 11 located below, that is, the left light 431 emits light toward the left edge of the deck 11. The right light 441 can also project light to the lower right side, so as to illuminate the right side of the deck 11 located below, that is, the right light 441 emits light toward the right edge of the deck 11. In this example, the left light 431, the right light 441, the first light 411, and the second light 412 can be lit simultaneously. In the vicinity of the display screen 221, there is also a light switch 2212 for controlling the left light 431, the right light 441, the first light 411 and the second light 412 to be lit simultaneously. When the user operates the light switch 2212, the left light 431, the right light 441, the first light 411, and the second light 412 can be lit simultaneously. In some examples, when the user operates the switch assembly 222 in the first operation mode, the riding lawn mower 100 is activated. At this time, the user can light up the left light 431 and the right light 441, the first light 411, and the second light 412 by triggering the light switch 2212. For the third light 416 and the fourth light 418, as long as the user operates the switch assembly 222 in the first operation mode to activate the riding lawn mower 100, the third light 416 and the fourth light 418 are lit. That is, when the riding lawn mower 100 is walking or working, the third light 416 and the fourth light 418 are always on. Therefore, the third light 416 and the fourth light 418 can also be considered as daytime lights of the riding lawn mower 100.

The rear lighting assembly 45 includes a rear light 451 arranged on the rear side of the frame 91. When the riding lawn mower 100 is activated, the user triggers the light switch 2212 to turn on the rear light 451. When the riding lawn mower 100 is activated, and the light switch 2212 is not triggered, the first light 411 and the second light 412 are off. At this time, if the riding lawn mower 100 reverses, the rear light 451 flashes to remind passers-by.

As shown in FIGS. 1 and 30-32, the riding lawn mower 100 further includes a charging system 60, and the charging system 60 is used to charge the power supply device 94. The charging system 60 includes a charging interface 61 provided on the riding lawn mower 100, and the charging interface 61 is used to access external electric power. The charging system 60 also includes a charging assembly 62 for outputting electric power to the charging interface 61. When the charging assembly 62 is connected to the charging interface 61, the charging assembly 62 can charge the power supply device 94. The charging interface 61 is provided on the left housing assembly 21 or the right housing assembly 22, so that the charging interface 61 is located on the left or right side of the seat 92 of the riding lawn mower 100, thereby facilitating user operations. Further, in the present example, the power supply device 94 is arranged on the rear side of the seat 92. The riding lawn mower 100 also includes a power supply management module 941 for controlling the power supply device 94. The power supply management module 941 is arranged on the rear side of the seat 92 and close to the seat 92, and the power supply management module 941 is arranged between the power supply device 94 and the seat 92. In this way, arranging the charging interface 61 on the left housing assembly 21 or the right housing assembly 22 can make the charging interface 61 closer to the power supply management module 941, thereby facilitating wiring and simplifying structure. Furthermore, arranging the charging interface 61 on the left or right side of the seat 92, rather than the rear side of the frame 91, can avoid the problem of inconvenient charging, and also avoid the problem of damaging the charging interface 61 during reversing.

The charging interface 61 is also located on the left side of the power supply device 94; of course, the charging interface 61 can also be provided on the right side of the power supply device 94. In this example, the charging interface 61 is provided on the left housing assembly 21 as an example.

A power access terminal 611 is provided in the charging interface 61, and the power access terminal 611 is connected to a charging circuit, which controls the charging system 60 to charge the power supply device 94. A safety switch 612 is also provided at the charging interface 61. When the safety switch 612 is triggered, the charging circuit controls the charging system 60 to enter a state capable of charging the power supply device 94, thereby improving safety performance. The power access terminal 611 is connected to the power supply management module 941 through a first cable 613, and the safety switch 612 is connected to the power supply management module 941 through a second cable 614. The power supply management module 941 is arranged on the lower side of the seat 92. The charging interface 61 is arranged close to the power supply management module 941, thereby shortening the length of the first cable 613 and the second cable 614, reducing the production cost, and also facilitating the installation of the first cable 613 and the second cable 614.

The charging interface 61 is also provided with a cover 615, the cover 615 seals the charging interface 61, to prevent dust from entering the charging interface 61, which may affect the conductive performance of the charging interface 61, and to prevent moist from entering the charging interface 61, which may lead to a short circuit of the charging interface 61. When the cover 615 is opened, the charging interface 61 is exposed. At this time, the safety switch 612 is not triggered, that is, just opening the cover 615 does not switch the charging system 60 to the state capable of charging the power supply device 94. The safety switch 612 needs to be triggered to make the charging system enter the state capable of charging the power supply device 94, thereby improving the safety performance of the charging system 60.

The charging assembly 62 includes a charging gun 621, an adapter 622, and a plug 623. The charging gun 621 is connected to the adapter 622, and the adapter 622 is connected to the plug 623. The charging gun 621 includes a power output terminal 6211 for engaging with the power access terminal. When the charging gun 621 is inserted into the charging interface 61, the safety switch 612 is triggered, thereby improving the safety performance. In other words, normally, the safety switch 612 can be triggered only when the charging gun 621 is inserted into the charging interface 61. The adapter 622 is provided between the charging gun 621 and the plug 623. The plug 623 is configured to connect to external electrical grid. The adapter 622 can convert the AC power connected to the plug 623 into DC power that can be adapted to the power supply device 94.

The left housing assembly 21 is provided with the above-mentioned second storage box 211, and the second storage box 211 may be configured in a shape for placing a cup. A third storage box 212 may be further provided on the left housing assembly 21, and the charging interface 61 is also provided on the rear side of the third storage box 212. A flip cover 213 is also provided on the third storage box 212, so that items that need to be waterproof and dustproof can be placed in the third storage box 212. The third storage box 212 is also provided with a suction device 214 for sealing the flip cover 213 of the third storage box 212, and the suction device 214 may be a magnet. A USB interface 215 is also provided in the third storage box 212 so as to charge devices such as mobile phones.

Figure 33:
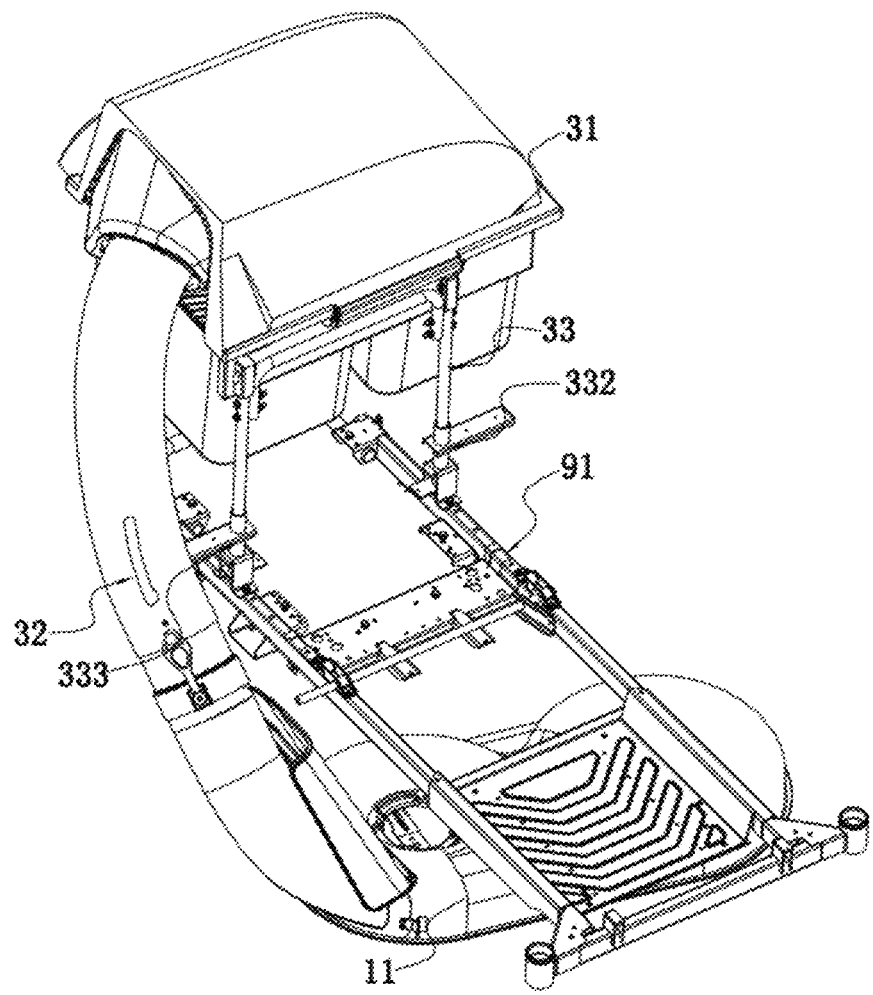
FIG. 33 is a perspective view of the frame and the grass catcher system in FIG. 1.

As shown in FIGS. 1 and 33, the grass catcher system 30 includes a grass catcher basket assembly 31, a connecting duct 32 and a mounting assembly 33. The grass catcher basket assembly 31 is arranged on the rear side of the seat 92, the grass catcher basket assembly 31 is used to collect grass clippings cut by the cutting system 10, the connecting duct 32 is used to connect the deck 11 and the grass catcher basket assembly 31, and the mounting assembly 33 is used to install the grass catcher basket assembly 31 to the frame 91.

As shown in FIGS. 33-37, the grass catcher basket assembly 31 includes a grass basket body 311 and a grass basket cover 312. The grass basket body 311 surrounds and forms a grass collecting space 3111 for accommodating grass clippings. The grass basket cover 312 covers the upwardly opened opening of the grass basket body 311.

The connecting duct 32 is formed with a channel 321 extending along an extension line 1i. The extension line 1i is basically a curve, that is, the channel 321 basically extends along the curve, so that it can smoothly guide the grass clippings from the deck 11 to the grass basket body 311. The connecting duct 32 includes a first end 322 and a second end 323 disposed at both ends of the extension line 1i. The first end 322 of the connecting duct 32 is connected to the deck 11 to make the mowing space 121 communicate with the channel 321, and the second end 323 of the connecting duct 32 is connected to the grass catcher basket assembly 31 so that the channel 321 communicates with the grass collecting space 3111 in the grass catcher basket assembly 31. The connecting duct 32 also includes an observation portion 324 for the user to observe to determine whether the grass catcher basket assembly 31 is full. The observation portion 324 surrounds the extension line 1i, that is, the extension line 1i passes through the observation portion 324, the observation portion 324 surrounds the extension line 1i; the observation portion 324 is a circular window. In this way, the user can conveniently determine whether the grass catcher basket assembly 31 is full of grass when sitting on the seat 92, and can also conveniently observe to determine whether the grass catcher basket assembly 31 is full of grass when the user is on the right side of the riding lawn mower 100, so as to improve user experience, making it convenient for the user to observe the grass in the grass catcher basket. The length of the circular window in the direction of the extension line 1i is greater than or equal to 50 mm and less than or equal to 150 mm, so that the size of the circular window is large enough to facilitate the user's observation.

The observation portion 324 is a perspective portion supported by a perspective material, so that the user can directly observe whether there is grass in the connecting duct 32 while sitting on the seat 92, so as to determine whether the grass catcher basket assembly 31 is full of grass.

The observation portion 324 is arranged on the right side of the seat 92, and the connecting duct 32 extends from the right side of the deck 11 to the right side of the grass catcher basket assembly 31. In this way, the ergonomic design can be satisfied, and it is convenient for more users to use the riding lawn mower 100. As shown in FIG. 4, the seat 92 includes a base 921 and a backrest 922. The base 921 is used for the user to sit thereon, and the backrest 922 is used for supporting the back of the user. The observation portion 324 is also arranged on the front side of the backrest 922, so that when the user sits on the seat 92, the observation portion 324 is arranged on the front right of the user, thereby facilitating the observation of the user.

Figure 34:
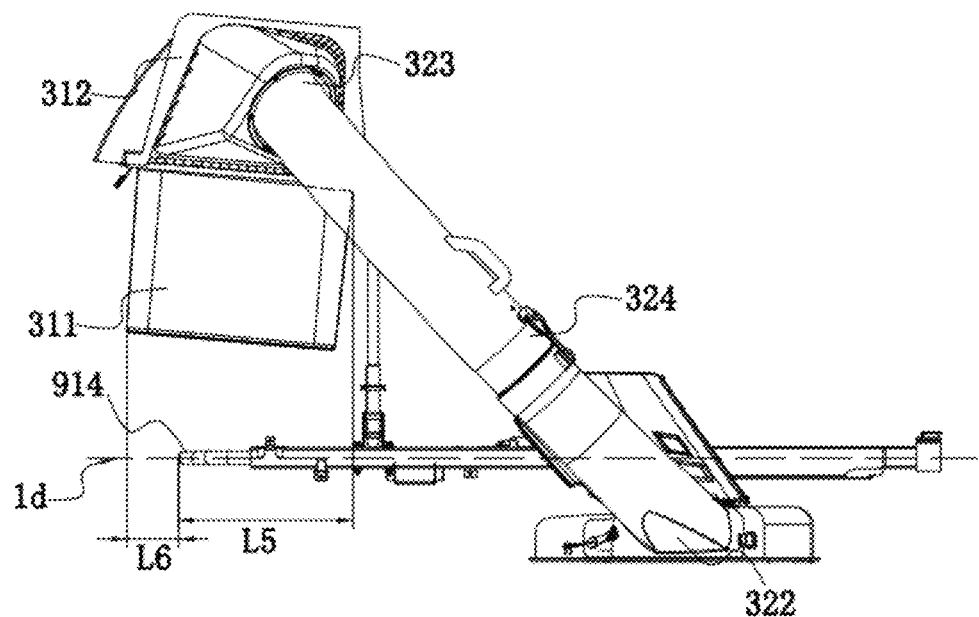
FIG. 34 is a plan view of the frame and the grass catcher system in FIG. 1.
Figure 35:
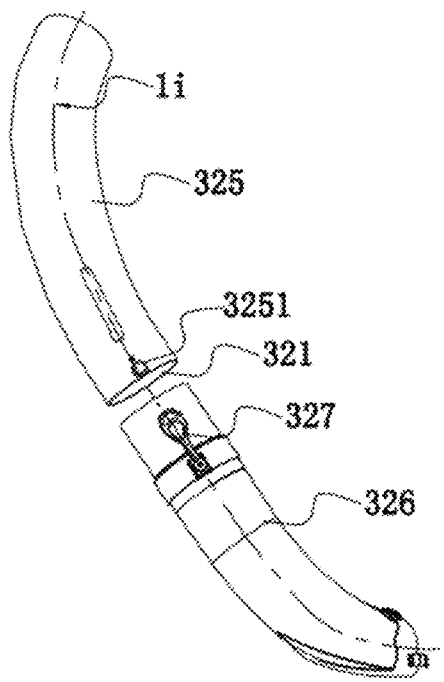
FIG. 35 is a perspective view of a connecting rod in FIG. 33 when a first connecting section and a second connecting section are separated.

In some examples, as shown in FIGS. 33-35, the connecting duct 32 includes: a first connecting section 325 and a second connecting section 326, the first connecting section 325 is connected to the grass catcher basket assembly 31, and the second connecting section 326 is connected to the deck 11, the first connecting section 325 and the second connecting section 326 can be made of a same material. The observation portion 324 is arranged between the first connecting section 325 and the second connecting section 326 and connects them. The observation portion 324 may be made of another material different from the first connecting section 325. The observation portion 324 is fixedly connected to the second connecting section 326, and the observation portion 324 and the first connecting section 325 form a detachable connection. In this way, when the connecting duct 32 is installed, the second connecting section 326 and the observation portion 324 can be installed as a whole to the deck 11, and then the first end 322 of the first connecting section 325 is extended into the grass catcher basket assembly 31, and finally the other end of the first connecting section 325 is connected to the observation portion 324, so that the connecting duct 32 can connect the grass basket catcher assembly 31 and the deck 11 more conveniently. Moreover, dividing the connecting duct 32 into two parts, the first connecting section 325 and the second connecting section also facilitates storage and transportation, as well as reduces the cost. Of course, it can be understood that in some other examples, the observation portion may also be fixedly connected to the first connecting section, and the observation portion and the second connecting section may be detachably connected.

A connecting piece 327 is connected to the outer wall formed by the whole of the observation portion 324 and the second connecting section 326, the first connecting section 325 is formed with a connecting portion 3251 for engaging with the connecting piece 327, and the connecting piece 327 is detachably connected to the connecting portion 3251. In some examples, the connecting piece 327 is fixedly connected to a second connecting duct 32, and the observation portion 324 is fixedly connected to the second connecting section 326 by means of injection molding, interference fit, or bonding. The connecting piece 327 is an elastic member. In some examples, the connecting piece 327 is a rubber. In this way, when the connecting piece 327 is connected to the connecting portion 3251, the first connecting section 325 can move relative to the whole formed by the observation portion 324 and the second connecting section 326. In other words, at this time, the first end 322 of the first connecting section 325 extending into the grass catcher basket assembly 31 can move relative to the grass basket body 311.

Figure 36:
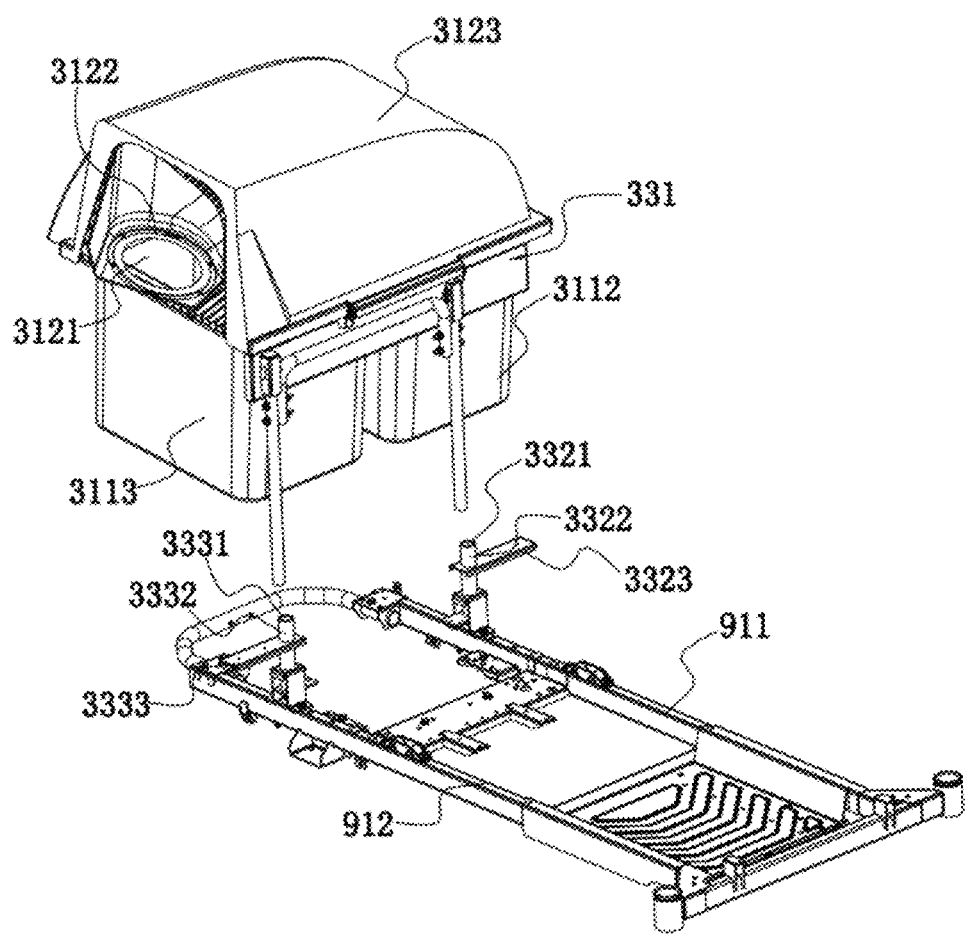
FIG. 36 is a perspective view of the frame, a grass catcher basket assembly and a mounting assembly in FIG. 33.
Figure 37:
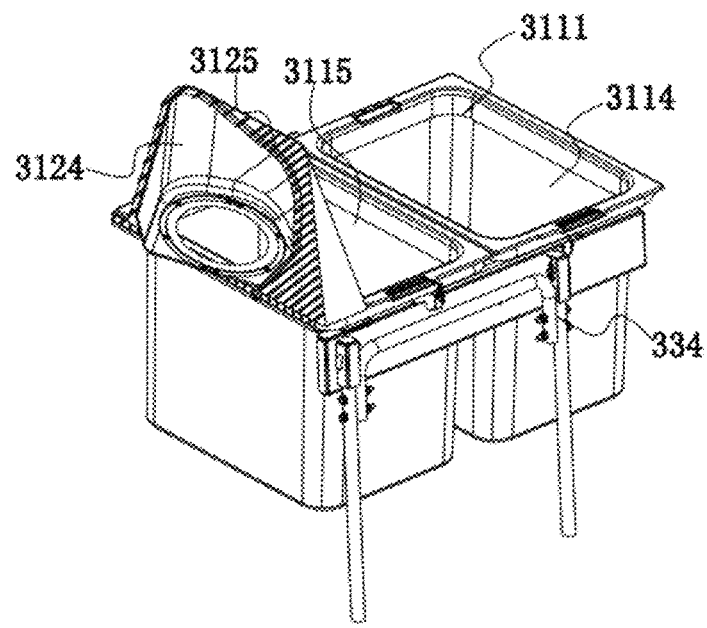
FIG. 37 is a partial perspective view of a grass basket cover, a grass basket body and the mounting assembly in FIG. 36.
Figure 38:
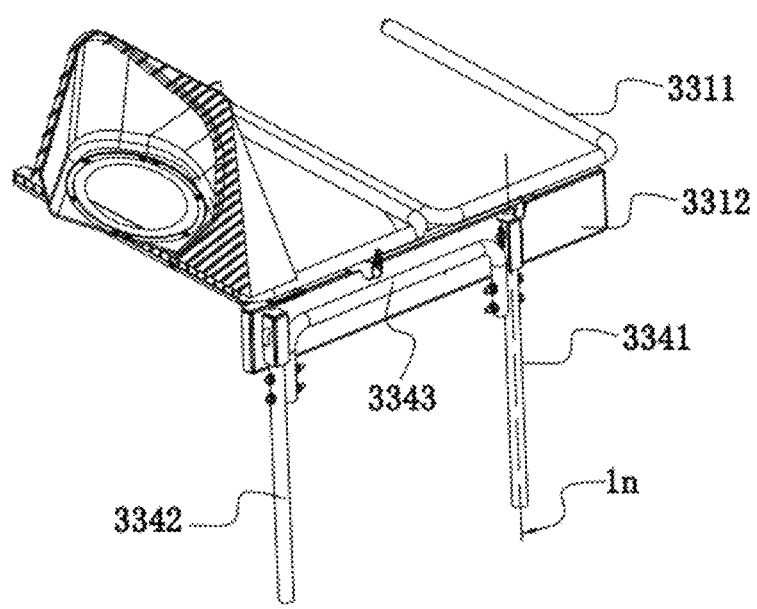
FIG. 38 is a partial perspective view of the grass basket cover and the mounting assembly in FIG. 37.
Figure 39:
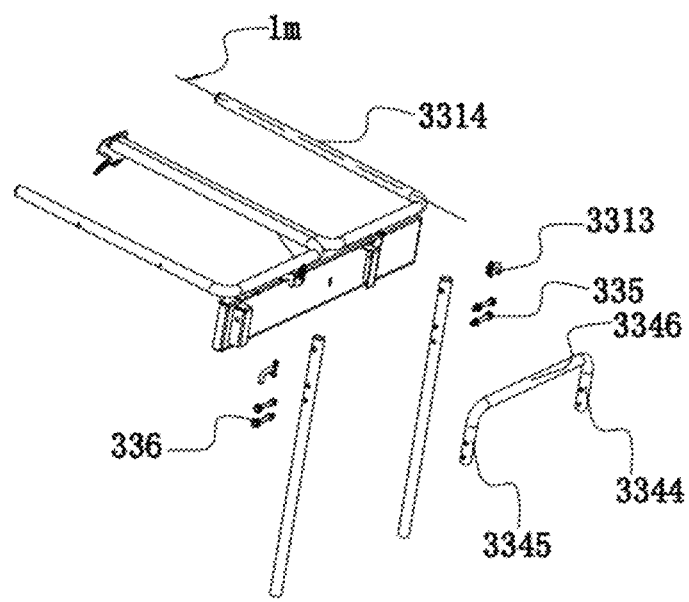
FIG. 39 is an exploded view of the mounting assembly in FIG. 38.

As shown in FIG. 36, the grass catcher basket assembly 31 is further formed with a hole 3121 for inserting the connecting duct 32, the hole 3121 is also provided with an annular rubber ring at its wall 3122. When the connecting duct 32 inserts into the hole 3121, the rubber ring 3122 surrounds the connecting duct 32 to achieve a better vibration damping effect.

As shown in FIGS. 2 and 34, the power supply device 94 is disposed between the seat 92 and the second lateral beam 914. The second lateral beam 914 is also the rear bumper, so that the rear bumper can protect the power supply device 94 from damage. The grass basket body 311 is provided on the upper side of the power supply device 94, and the grass basket body 311 protrudes rearward from the power supply device 94 in the front and rear direction of the riding lawn mower 100. In this way, the grass basket body 311 can protect the power supply device 94, so that the riding lawn mower 100 has a more reliable structure and a longer service life. The grass basket body 311 at least partially protrudes from the rear bumper in the front and rear direction of the riding lawn mower 100, so that, on the one hand, when the riding lawn mower 100 hits an obstacle while walking reversely, the grass catcher basket assembly plays a buffering role, so as to protect the power supply device 94; on the other hand, the grass catcher basket assembly protrudes backwards from the rear bumper, which also moves the center of gravity of the entire riding lawn mower 100 backwards, thereby improving the stability of the riding lawn mower 100. At least part of the grass basket body 311 protrudes to the left from the first longitudinal beam 911 in the direction along the lateral line 1e. In this way, the connecting duct 32 can be arranged on the right side of the riding lawn mower 100. Therefore, the size of the connecting duct 32 protruding to the right from the second longitudinal beam 912 can be smaller, which is beneficial to reduce the size of the entire riding lawn mower 100, and also allows the connecting duct 32 to have a smooth connection to the grass catcher basket assembly 31, improving the efficiency of grass collecting.

As shown in FIGS. 3 and 34-38, the grass basket body 311 includes a first grass basket portion 3112 and a second grass basket portion 3113. The first grass basket portion 3112 surrounds and forms a first chamber 3114, and the second grass basket The portion 3113 surrounds and forms a second chamber 3115, the first grass basket portion 3112 and the second grass basket portion 3113 are symmetrically arranged about a plane 1j, and the distance between the plane 1j and the first longitudinal beam 911 is smaller than the distance between the plane 1j and the second longitudinal beam 912, that is, the plane 1j is not set at the middle position of the first longitudinal beam 911 and the second longitudinal beam 912, so that the grass basket body 311 protrudes from the frame 91 to the left. In this example, it can be defined that the frame 91 is basically symmetrically arranged with respect to a midsagittal plane 1k, then the plane 1j is set on the left side of the midsagittal plane 1k, and the first grass basket portion 3112 is disposed on the left side of the midsagittal plane 1k. The midsagittal plane 1k passes through the second grass basket portion 3113. The first longitudinal beam 911 and the second longitudinal beam 912 are symmetrically arranged on both sides of the midsagittal plane 1k, the first grass basket portion 3112 and the second grass basket portion 3113 are symmetrical about the plane 1j, and the plane 1j is parallel to and does not overlap with the midsagittal plane 1k. In some examples, the distance L4 between the plane 1j and the first longitudinal beam 911 is greater than or equal to 80 mm and less than or equal to 200 mm, and the grass basket body 311 does not protrude to the right from the second longitudinal beam 912 in the direction along the lateral line 1e. This design can ensure that the stability of the whole machine meets the requirements, and also allows the riding lawn mower 100 to have enough space to install the connecting duct 32, so that the connecting duct 32 is connected from the right side of the grass catcher basket assembly 31 to the grass basket cover 312.

The grass basket body 311 has a projection in a plane parallel to the longitudinal line 1d and parallel to the lateral line 1e. The ratio of the dimension L5 of the part of the projection located on the front side of the rear bumper to the dimension L6 of the part of the grass basket body 311 on the rear side of the rear bumper is greater than or equal to 2 and less than or equal to 4. Thus, the center of gravity of the riding lawn mower 100 is moved backward, which improves the stability of the riding lawn mower 100 and, at the same time, avoids the center of gravity of the riding lawn mower 100 to be too backward to affect the climbing performance of the riding lawn mower 100.

The grass basket cover 312 includes a rotating portion 3123 and a fixing portion 3124, the rotating portion 3123 is rotatably connected with the mounting assembly 33, and the fixing portion 3124 is fixedly connected with the mounting assembly 33. When the rotating portion 3123 is opened by the user, the grass basket body 311 opens upward for the user to more directly observe the grass clippings inside the first grass basket portion 3112 and the second grass basket portion 3113. The above-mentioned hole into which the connecting duct 32 is inserted is provided on the fixing portion 3124. The outer wall of the fixing portion 3124 is also formed with guiding ribs 3125 for guiding the airflow from the grass basket body 311 to the outside, so that the airflow can flow out from the gap between the rotating portion 3123 and the fixing portion 3124, thereby preventing the airflow from swirling in the grass basket body 311.

As shown in FIG. 33 and FIG. 36-39, the mounting assembly 33 includes: a supporting assembly 331, a first mounting base set 332, a second mounting base set 333, and a connecting rod assembly 334. The supporting assembly 331 is used to support the grass basket body 311, the first mounting base set 332 is fixedly connected to the first longitudinal beam 911, the second mounting base set 333 is fixedly connected to the second longitudinal beam 912, the first mounting base set 332 is also formed with a first mounting hole 3321, and the second mounting base set 333 is also formed with a second mounting hole 3331, and the connecting rod assembly 334 includes a first connecting rod 3341 detachably inserted into the first mounting hole 3321 and a second connecting rod 3342 detachably inserted into the second mounting hole 3331. Wherein the supporting assembly 331 is connected to the connecting rod assembly 334; and the first connecting rod 3341 and the second connecting rod 3342 form a detachable connection that can be separated from each other. In this way, when installing the grass catcher system 30, the first connecting rod 3341 can be inserted into the first mounting hole 3321, and then the second connecting rod 3342 can be inserted into the second mounting hole 3331. Finally, the first connecting rod 3341 and the second connecting rod 3342 are connected together through some mechanisms, so that the grass catcher system 30 is installed to the frame 91, so that the user can install the grass catcher system 30 to the frame 91 through simple operations. The first connecting rod 3341 and the second connecting rod 3342 can be separated from each other, so that the entire grass catcher system 30 is easier to install, avoiding fixing the first connecting rod 3341 and the second connecting rod 3342 as a whole, which makes it difficult to make the first connecting rod 3341 and the second connecting rod 3342 respectively correspond to the first mounting holes 3321 and the second mounting hole 3331 when installing the grass catcher system 30. In other words, even if the first connecting rod 3341 and the second connecting rod 3342 can respectively correspond to the first mounting hole 3321 and the second mounting hole 3331, this may reduce the stability of the connection between the grass catcher system 30 and the frame 91. The first connecting rod 3341 and the second connecting rod 3342 form a detachable connection that can be separated from each other, which means that the first connecting rod 3341 can be separated from the second connecting rod 3342 without damaging the original structure of the first connecting rod 3341 and the second connecting rod 3342, for example, the first connecting rod 3341 and the second connecting rod 3342 form a snap connection, a threaded connection, or a screw connection, or the first connecting rod 3341 and the second connecting rod 3342 are connected by an intermediate piece.

The supporting assembly 331 includes: a supporting base 3311 and a connecting plate 3312, the supporting base 3311 is used to support the grass basket body 311, the number of the supporting base 3311 is two, and the two supporting bases 3311 are used to support the first grass basket portion 3112 and the second grass basket portion 3113. The connecting plate 3312 is fixedly connected to the supporting bases 3311, and the connecting plate 3312 can be welded to the supporting bases 3311, so that the structural strength of the supporting assembly 331 can be improved. The supporting assembly 331 and the connecting rod assembly 334 form a detachable connection. For example, in this example, the supporting assembly 331 is connected to the connecting rod assembly 334 through a pin 3313. The supporting assembly 331 and the connecting rod assembly 334 form a detachable connection, which still enables the grass catcher system 30 to be disassembled into multiple components for storage during transportation, thereby saving storage space. The rotating portion 3123 of the grass basket cover 312 is rotatably connected to the connecting plate 3312, so that when the rotating portion 3123 is opened, the grass basket body 311 opens upward.

The supporting base 3311 includes a supporting portion 3314 extending along a straight line 1 $m$, and the grass basket body 311 is supported on the supporting portion 3314. The supporting portion 3314 can also guide the grass basket body 311 to be coupled to the supporting portion 3314 along the straight line 1 $m$. The direction of the straight line 1$m$ obliquely intersects the front and rear direction of the riding lawn mower 100 to form an angle greater than 0 degrees and less than or equal to 20 degrees, that is, the direction of the straight line 1$m$ obliquely intersects with the longitudinal line 1$d$ to form an angle greater than 0 degrees and less than or equal to 20 degrees. In this way, when the grass basket body 311 is filled with grass, the weight of the grass catcher basket assembly 31 will increase, pressing the supporting portion 3314 downward. At this time, because the supporting portion 3314 itself is inclined upward, even if the supporting portion 3314 is pressed down, the grass basket body 311 will not fall. In other words, the inclined arrangement of the supporting portion 3314 can alleviate the falling problem of the grass catcher basket assembly 31.

The connecting rod assembly 334 further comprises: an intermediate rod 3343, the intermediate rod 3343 is disposed between a first connecting rod 3341 and a second connecting rod 3342 to connect the first connecting rod 3341 and second connecting rod 3342. In this way, the first connecting rod 3341 and the second connecting rod 3342 can be installed to the first mounting hole 3321 and the second mounting hole 3331, respectively, and then connected to each other through the intermediate rod 3343, thereby realizing the fixed connection of the first connecting rod 3341 and the second connecting rod 3342, as well as the stable installation of the connecting rod assembly 334 to the frame 91. The first connecting rod 3341 extends along a straight line, and the second connecting rod 3342 extends in a direction parallel to the extending direction of the first connecting rod 3341. In this example, both the first connecting rod 3341 and the second connecting rod 3342 extend along a vertical line 1$n$, the vertical line 1$n$ is perpendicular to the longitudinal line 1$d$, and the vertical line 1$n$ is also perpendicular to the lateral line 1$e$. The intermediate rod 3343 is U-shaped. The intermediate rod 3343 includes a left connecting portion 3344, a right connecting portion 3345, and an intermediate portion 3346. The left connecting portion 3344 is connected to the first connecting rod 3341, and the right connecting portion 3345 is connected to the second connecting rod 3342, and the intermediate portion connects the left connecting portion 3344 and the right connecting portion 3345. The left connecting portion 3344 is connected to the first connecting rod 3341 by a first screw set 335, so that the intermediate rod 3343 and the first connecting rod 3341 form a detachable connection. The right connecting portion 3345 is connected to the second connecting rod 3342 through a second screw set 336 so that the intermediate rod 3343 and the second connecting rod 3342 form a detachable connection. In this way, on the one hand, the intermediate rod 3343 can serve the purpose of connecting the first connecting rod 3341 and the second connecting rod 3342, so that the first connecting rod 3341 and the second connecting rod 3342 are relatively fixed in the direction of the lateral line 1$e$, on the other hand, the intermediate rod 3343 can also play a role in strengthening the mounting assembly 33, thereby avoiding the problem of insufficient strength of the first connecting rod 3341 and the second connecting rod 3342.

The first mounting base set 332 includes a first mounting column 3322 and a first extension bracket 3323, and the second mounting base set 333 includes a second mounting column 3332 and a second extension bracket 3333. The first mounting column forms the above-mentioned first mounting hole 3321, and the second mounting column forms the above-mentioned second mounting hole 3331. The first extension bracket 3323 extends from the first mounting column 3322 to a direction away from the first mounting column 3322, and the second extension bracket 3333 extends from the second mounting column 3332 to a direction away from the second mounting column 3332. The left housing assembly 21 is fixedly connected to the first extension bracket 3323, and the right housing assembly 22 is fixedly connected to the second extension bracket 3333. Thus, the strength of the first mounting base set 332 and the second mounting base set can be improved, and the problems of inconvenient installation and structural instability caused by direct installation of the left housing assembly 21 and the right housing assembly 22 to the first longitudinal beam 911 and the second longitudinal beam 912 can be avoided. The first mounting column and the first extension bracket 3323 are welded into one piece, and the second mounting column and the second extension bracket 3333 are welded into one piece. The first mounting base set 332 is connected to the first longitudinal beam 911 by screws, and the second mounting base set 333 is connected to the second longitudinal beam 912 by screws. Thus, the first mounting base set 332 needs to bear the weight of the left housing assembly 21 on the left side of the seat 92 and the grass catcher system 30 on the rear side of the seat 92, so that the weight distribution of the first mounting base set 332 is relatively uniform, thereby increasing the service life of the riding lawn mower 100. Similarly, the second mounting base set 333 needs to bear the weight of the right housing assembly 22 on the right side of the seat 92 and the grass catcher system 30 on the rear side of the seat 92, so that the weight distribution of the second mounting base set 333 is relatively uniform, thereby increasing the service life of the riding lawn mower 100.

In this way, to install the mounting assembly 33 to the frame 91, first insert the first connecting rod 3341 into the first mounting hole 3321, and insert the second connecting rod 3342 into the second mounting hole 3331, and then connect the intermediate rod 3343 to the first connecting rod 3341 and the second connecting rod 3342, and finally connect the supporting assembly 331 to the connecting rod assembly 334, thereby, the grass catcher system 30 can be installed to the frame 91 through simple operations.

Figure 40:
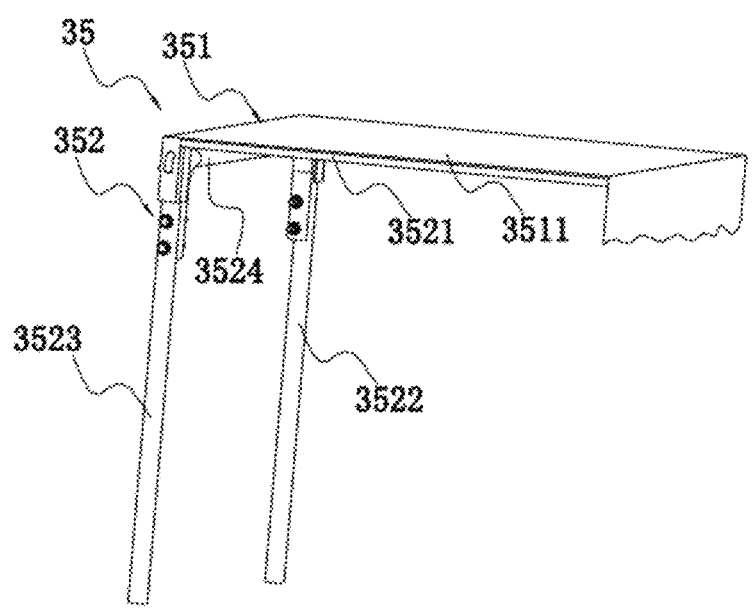
FIG. 40 is a perspective view of a sunshade suitable for the riding lawn mower in FIG. 1.

In this example, the structures of the first mounting base set 332 and the second mounting base set 333 are simple, the first mounting column forms the first mounting hole 3321, and the second mounting column forms the second mounting hole 3331. The first mounting hole 3321 and the second mounting hole 3331 can be used for installing the grass catcher system 30 to the frame 91. The first mounting base set 332 and the second mounting base set 333 have strong versatility and can also be applicable to a sunshade 35 as shown in FIG. 40. The sunshade 35 includes a sunshade assembly 351 and a mounting assembly 352 for installing the sunshade assembly 351 to the riding lawn mower 100. The sunshade assembly 351 includes a sunshade cover 3511. The mounting assembly 352 includes a supporting base 3521 and a connecting rod assembly. The supporting base 3521 is used to support the sunshade 3511. The connecting rod assembly includes a first connecting rod 3522, a second connecting rod 3523 and an intermediate rod 3524. The supporting base 3521 is connected with the connecting rod assembly, and the first connecting rod 3522 and the second connecting rod 3523 form a detachable connection that can be separated from each other. In some examples, the intermediate rod 3524 is detachably connected with the first connecting rod 3522 and the second connecting rod 3523, respectively.

Figure 41:
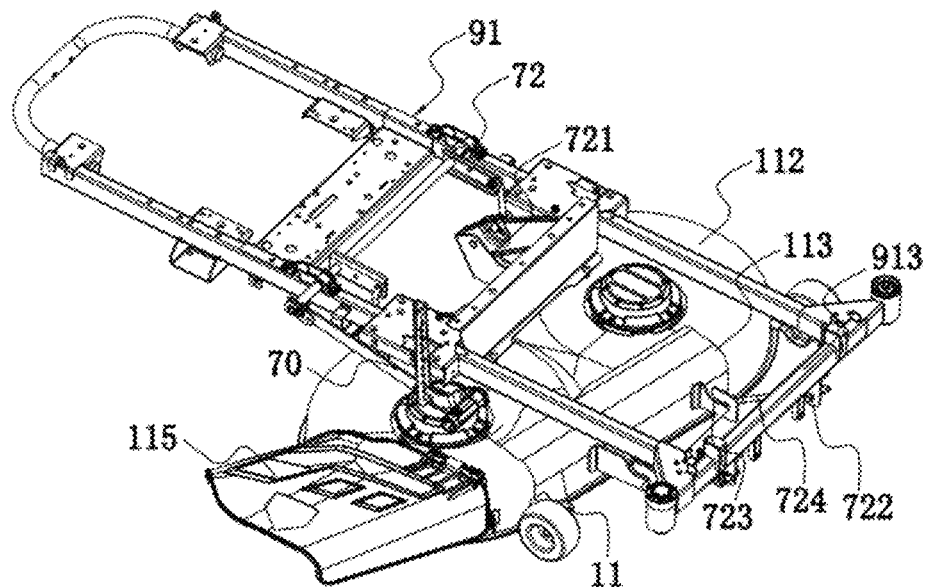
FIG. 41 is a perspective view of the frame, a height adjustment system and the cutting system in FIG. 1.
Figure 42:
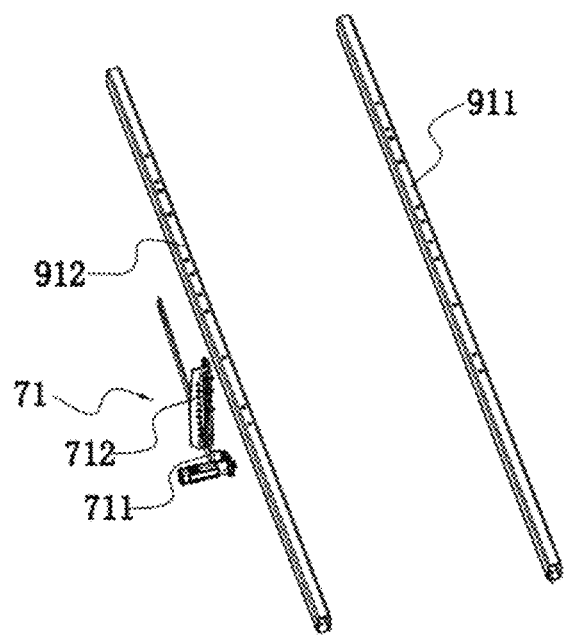
FIG. 42 is a perspective view of a gear assembly, a first longitudinal beam and a second longitudinal beam in FIG. 41.
Figure 43:
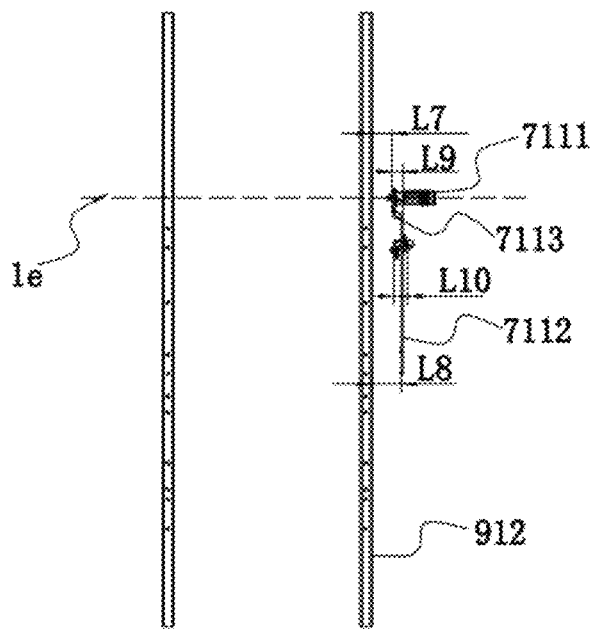
FIG. 43 is a plan view of the structure shown in FIG. 42.
Figure 44:
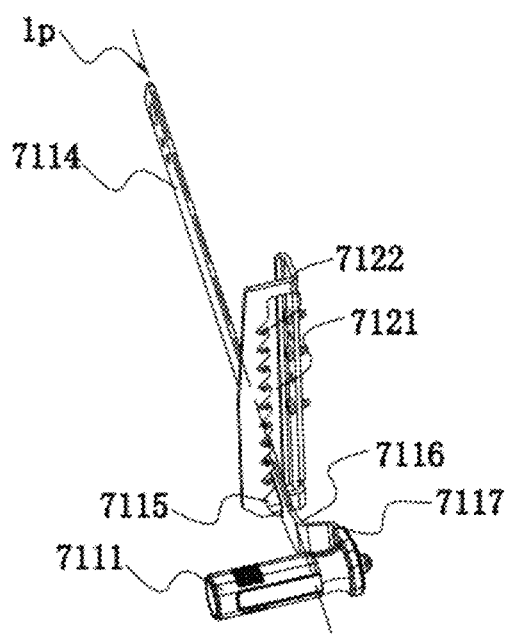
FIG. 44 is a perspective view of the gear assembly in FIG. 42.

As shown in FIGS. 1 and 41, the riding lawn mower 100 further includes a height adjustment system 70 for adjusting the height of the cutting system 10 relative to the frame 91. As shown in FIGS. 41 and 42, the height adjustment system 70 includes: a gear assembly 71 and a linkage assembly 72. The gear assembly 71 includes an adjusting member 711 and a limiting member 712. The adjusting member 711 is used for user operation, and the limiting member 712 is used to limit the adjusting member 711 to a predefined gear position, and the linkage assembly 72 connects the gear assembly 71 and the deck 11. When the user operates the adjusting member 711, the adjusting member 711 can move to different predefined gear positions relative to the limiting member 712, and the linkage assembly 72 drives the height of the deck 11 to change under the driving of the adjusting member 711, thereby allowing the riding lawn mower 100 to have different cutting heights.

As shown in FIGS. 41 to 44, the adjusting member 711 includes an adjusting handle 7111, a gear portion 7112, and a bending portion 7113. The adjusting handle 7111 is configured to be operated by the user, the gear portion 7112 engages with the limiting member 712 to make the gear portion 7112 stay at predefined gear positions, and the bending portion 7113 connects the adjusting handle 7111 and the gear portion 7112. The bending portion 7113 is bent from the gear portion 7112 toward the body 100a so that the adjusting handle 7111 is closer to the body 100a in the left and right direction relative to the gear portion 7112. The bending portion 7113 is bent from the gear portion 7112 toward the frame 91 so that the adjusting handle 7111 is closer to the frame 91 in the left and right direction relative to the gear portion 7112. The adjusting handle 7111 is provided on the right side of the frame 91 because the bending portion 7113 is bent toward the frame 91 in the left and right direction, so that the adjusting handle 7111 is closer to the frame 91 comparing with the case without the bending portion 7113. It is understood that, the deck 11 is connected to the grass catcher system 30 through a connecting duct 32, and a flip cover 115 is also connected to the deck 11, and the flip cover 115 has a first position and a second position. When the flip cover 115 is in the first position, the riding lawn mower 100 is in a grass discharging mode. At this time, the clippings cut by the cutting system 10 can be discharged to the right side of the riding lawn mower 100 through the flip cover 115. When the flip cover 115 is in the second position, the deck 11 can be connected to the grass catcher system 30 through the connecting duct 32. At this time, the riding lawn mower 100 is in the grass catching mode, so that the grass clippings cut by the cutting system 10 pass through the flip cover 115 can be discharged to the grass basket body 311. In this example, the distance between the adjusting handle 7111 and the second longitudinal beam 912 is relatively small, so that when the flip cover 115 is rotated from the first position to the second position, the adjusting handle 7111 will not interfere with the movement of the flip cover 115. In other words, under the condition that the adjusting handle 7111 does not interfere with the movement of the flip cover 115, the size of the adjusting handle 7111 can be increased as much as possible, so as to allow comfort operation for the user with the adjusting handle 7111. That is, if the adjusting member 711 were not provided on the bending portion 7113, then in the left and right direction, the adjusting handle 7111 will be far away from the frame 91, so the adjusting handle 7111 will interfere with the movement of the flip cover 115, or the size of the adjusting handle 7111 will be reduced and thus affect the comfort of holding the adjusting handle 7111. The lateral line 1e is parallel to the left and right direction of the riding lawn mower 100, and the distance L7 between the adjusting handle 7111 and the second longitudinal beam 912 in the direction of the lateral line 1e is less than the distance L8 between the gear portion 7112 and the second longitudinal beam 912 in the direction of the lateral line 1e, thereby making the distance between the adjusting handle 7111 and the second longitudinal beam 912 shorter.

In some examples, the limiting member 712 is formed with a limiting hole 7121, and a plurality of limiting structures 7122 are formed on the wall of the limiting hole 7121. The gear portion 7112 passes through the limiting hole 7121, the gear portion 7112 includes an extension portion 7114 extending along a straight line 1p. The straight line 1p is perpendicular to the lateral line 1e. A gear structure 7115 protrudes from the extension portion 7114. When the gear structure 7115 engages with different limiting structures 7122, the deck 11 is at different heights. The bending portion 7113 has a first end 7116 and a second end 7117, the first end 7115 is connected to the gear portion 7112, and the second end 7117 is connected to the adjusting handle 7111. In the direction of the lateral line 1e, the second longitudinal beam 912 is arranged closer to the adjusting handle 7111 relative to the first longitudinal beam 911. In the direction of the lateral line 1e, the distance between the second end and the second longitudinal beam 912 is less than the distance between the first end 7116 and the second longitudinal beam 912. In other words, the bending of the bending portion 7113 toward the frame 91 does not restrict the bending direction of the bending portion 7113, but rather, the bending portion 7113 is bent toward the frame 91 so that the bending portion 7113 has a component bending toward the second longitudinal beam 912 in the left and right direction, so that the adjusting handle 7111 can be closer to the frame 91 in the left and right direction relative to the gear portion 7112. The bending portion 7113 and the gear portion 7112 are integrally formed. The dimension L9 of the bending portion 7113 in the left and right direction is smaller than the maximum size L10 of the limiting hole 7121 in the left and right direction. This can prevent the size of the bending portion 7113 from being too large, which hinders the entirety of the gear portion 7112 and the bending portion 7113 from passing through the limiting hole 7121. In some examples, the dimension L9 of the bending portion 7113 in the direction of the lateral line 1e is greater than or equal to 20 millimeters and equal to or less than 40 millimeters.

In this example, the minimum distance L7 between the adjusting handle 7111 and the second longitudinal beam 912 in the direction of the lateral line 1e is less than or equal to 100 mm. The length of the adjusting handle 7111 in the direction of the lateral line 1e is greater than or equal to 80 mm and less than or equal to 150 mm, so that the size of the adjusting handle 7111 is basically the same as the width of the user's palm, or the size of the adjusting handle 7111 is greater than the width of the user's palm, thereby making it convenient for the user to hold.

The adjusting handle 7111 is connected to the bending portion 7113, and the adjusting handle 7111 extends from the bending portion 7113 in the left and right direction toward a direction away from the second longitudinal beam 912. That is, the free end of the adjusting handle 7111 is far away from the second longitudinal beam 912, thereby facilitating user operation, and the extending direction of the adjusting handle 7111 is parallel to the lateral line 1e, which is also convenient for the user to hold.

The linkage assembly 72 includes a transmission member 721 connected to the top wall 112 of the deck 11. The height adjustment system 70 also includes: a first fixing member 722, a second fixing member 723, and a connecting assembly 724. The first fixing member 722 is fixedly connected to the first lateral beam 913, and the second fixing member 723 is fixedly connected to the side wall 113 of the deck 11. The connecting assembly 724 connects the first fixing member 722 and the second fixing member 723. In this way, the connection point of the connecting assembly 724 and the deck 11 is located below the highest point of the top wall 112 of the deck 11, so that the stability of the connection of the height adjustment system 70 to the deck 11 can be improved. In some examples, the second fixing member 723 is also provided on the side wall 113 on the front side of the deck 11.

Figure 45:
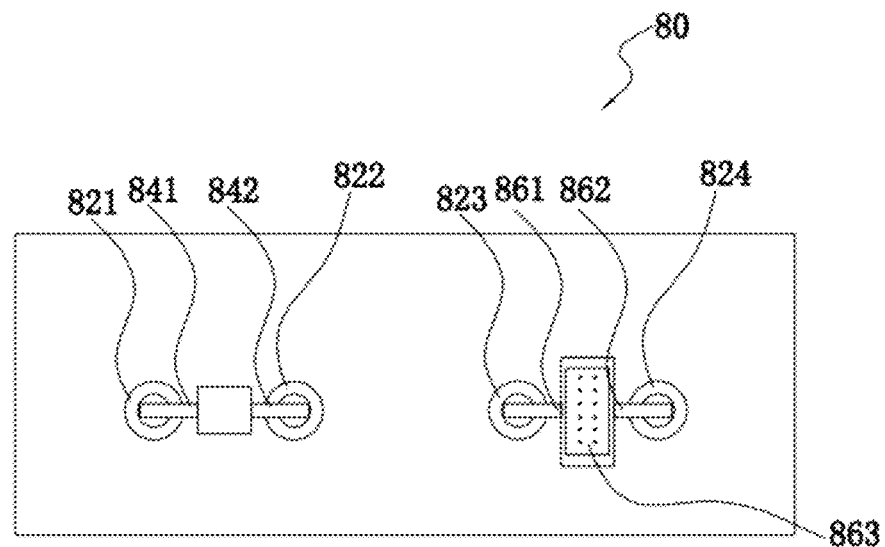
FIG. 45 is a schematic plan view of a circuit board of the riding lawn mower in FIG. 1.

As shown in FIGS. 1 and 45, the riding lawn mower 100 further includes: a circuit board 80. The circuit board 80 can be a circuit board in the control module 95, the circuit board 80 can also be a circuit board in the power management module 941, and the circuit board 80 can also be a circuit board in the lighting system 40 or a power supply display device. In fact, the circuit board 80 can be any circuit board of the riding lawn mower 100 that is used to electrically connect with the electric equipment to control the electric equipment.

Figure 46:
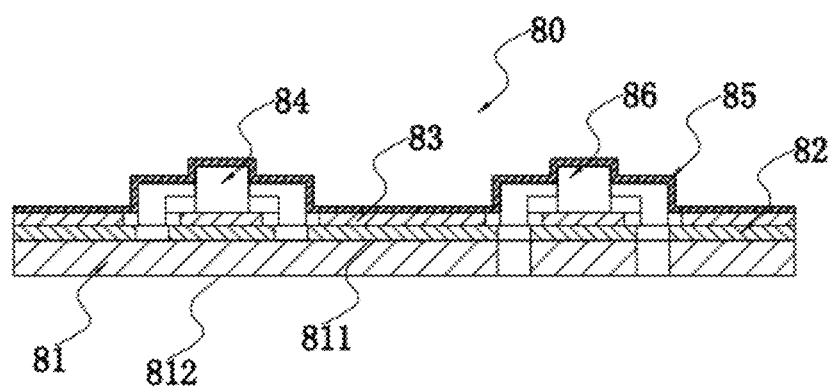
FIG. 46 is a cross-sectional view of the circuit board in FIG. 45.

As shown in FIGS. 45 and 46, the circuit board 80 includes a substrate board 81, a printed circuit layer 82, and an insulating layer 83. The substrate board 81 may be a plastic substrate board or an aluminum substrate board. The substrate board 81 has a first surface 811 and a second surface 812, and the first surface 811 and the second surface 812 are two opposite surfaces. For the circuit board 80, the first surface 811 and the second surface 812 can be understood as the two largest surfaces of the substrate board 81. The printed circuit layer 82 is disposed on the first surface 811, and the printed circuit layer 82 is made of metal conductive materials. The insulating layer 83 covers the upper side of the printed circuit layer 82, and the insulating layer 83 is made of insulating materials. When the insulating layer 83 covers the printed circuit layer 82, a first conductive portion 821 and a second conductive portion 822 are exposed on the printed circuit layer 82. That is, the insulating layer 83 does not completely cover the printed circuit layer 82. The first conductive portion 821 and the second conductive portion 822 are not covered by the insulating layer 83. The circuit board 80 also includes a first type of electronic component 84, and the first type of electronic component 84 can be mounted to the first conductive portion 821 and the second conductive portion 822. The first type of electronic component 84 includes a first connecting portion 841 and a second connecting portion 842, the first connecting portion 841 is electrically connected to the first conductive portion 821, and the second connecting portion 842 is electrically connected to the second conductive portion 822. The circuit board 80 further includes a waterproof layer 85, and the waterproof layer 85 is vapor-deposited to cover at least part of the whole formed by the insulating layer 83 and the first type of electronic component 84 with substantially the same thickness. In this example, the waterproof layer 85 covers the whole formed by the insulating layer 83 and the first type of electronic component 84. After the waterproof layer 85 is covered on the first type of electronic component 84, the first connecting portion 841 and the second connecting portion 842 are insulated from each other on the path through which the waterproof layer 85 is connected, that is, after the waterproof layer 85 is covered on the first type of electronic component 84, there is no short circuit between the first connecting portion 841 and the second connecting portion 842. In this way, the first connecting portion 841 is connected to the first conductive portion 821, and the second connecting portion 842 is connected to the second conductive portion 822, so that the first type of electronic component 84 is connected to the circuit formed by the printed circuit layer 82. However, the waterproof layer 85 covers the whole formed by the first type of electronic component 84 and the insulating layer 83, so that the first type of electronic component 84 will not come into contact with external dust and water vapor, thereby playing the role of dustproof, waterproof, and corrosion-proof. At the same time, the waterproof layer 85 is covered on the insulating layer 83 by vapor deposition, so that the thickness of the waterproof layer 85 on the circuit board 80 is relatively uniform, and the waterproof performance of the circuit board 80 is improved. Further, when the circuit board 80 needs to be repaired, plasma technology can be used to peel off the waterproof layer 85 on the circuit board 80, and it can ensure that the waterproof layer 85 on the circuit board 80 is peeled without residue. Furthermore, a large number of circuit boards 80 can be simultaneously coated with the waterproof layer 85 by means of vapor deposition, thereby improving production efficiency, reducing production costs, and shortening the production cycle.

In this example, the circuit board 80 is further provided with a second type of electronic component 86, and the second type of electronic component 86 includes a third connecting portion 861 and a fourth connecting portion 862. When the insulating layer 83 covers the printed circuit layer 82, a third conductive portion 823 and a fourth conductive portion 824 are exposed on the printed circuit layer 82. In other words, the insulating layer 83 does not completely cover the printed circuit layer 82, and the third conductive portion 823 and the fourth conductive portion 824 are not covered by the insulating layer 83. The third connecting portion 861 is electrically connected to the third conductive portion 823, and the fourth connecting portion 862 is electrically connected to the fourth conductive portion 824, so that the second type of electronic component 86 is mounted on the circuit board 80, and the second type of electronic component 86 is connected in the circuit formed by the printed circuit layer 82. The waterproof layer 85 also covers the second type of electronic component 86. After the waterproof layer 85 covers the second type of electronic component 86, the third connecting portion 861 and the fourth connecting portion 862 are insulated from each other on the path through which the waterproof layer 85 is connected. In this example, the second type of electronic component 86 further includes a current access terminal 863. When the waterproof layer 85 covers the current access terminal 863, the current access terminal 863 can still be electrically connected to an external port to introduce current to the circuit board 80. In other words, although the waterproof layer 85 covers the current access terminal 863, the waterproof layer 85 does not affect the conduction of the current access terminal 863 with the outside world. Therefore, for the second type of electronic component 86, the surface is covered by the waterproof layer 85, which on the one hand ensures that the second type of electronic component 86 will not be interfered by external moisture and dust, on the other hand, allows the second type of electronic component 86 to be connected to the outside world. Compared with the application of encapsulating glue on the circuit board 80 in the related art, although the encapsulating glue can also play a role in waterproofing, if the electronic components are covered by the encapsulating glue, the electronic components cannot be connected to the outside world. In other words, for electronic components that need to be electrically connected to the outside world, the surface cannot be coated with encapsulating glue, which will make this type of electronic component susceptible to dust and moist in the external environment.

In this example, the first type of electronic component 84 is a chip, such as a chip capacitor, a chip resistor, etc., and the second type of electronic component 86 is a plug-in, such as a plug-in capacitor, a switch, and the like. Of course, it can be understood that in some other examples, the first type of electronic component may also be plug-ins, and the second type of electronic component may also be patches.

In some examples, the second type of electronic component 86 is a plug interface that can be connected to an external port. In this way, even if the waterproof layer 85 covers the second type of electronic component 86, the external port can be inserted into the plug interface and form an electrical connection with the plug interface.

Figure 47:
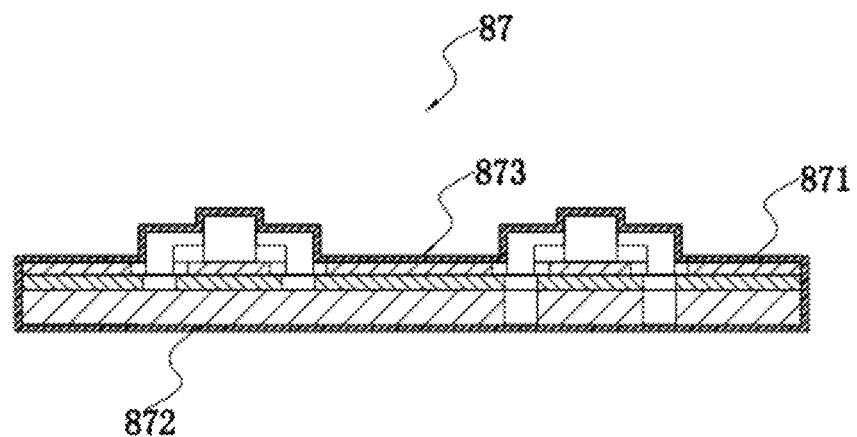
FIG. 47 is a cross-sectional view of another circuit board suitable for the riding lawn mower in FIG. 1.

In this example, the waterproof layer 85 covers the whole composed of the insulating layer 83, the printed circuit layer 82, the first type of electronic component 84 and the second type of electronic component 86. When the insulating layer 83 and the printed circuit layer 82 covers the substrate board 81, and the first type of electronic component 84 and the second type of electronic component 86 are mounted on the substrate board 81, the waterproof layer 85 is covered on the whole formed by the substrate board 81 and the insulating layer 83, the printed circuit layer 82, the first type of electronic component 84 and the second type of electronic component 86. In this example, the printed circuit layer 82 is provided on the first surface 811 of the substrate board 81, and the waterproof layer 85 may cover the first surface 811 of the substrate board 81. In other examples, as shown in FIG. 47, in order to better protect the circuit board 87, the first surface 871 and the second surface 872 of the circuit board 87 may be covered with the waterproof layer 873, or the entire circuit board 87 may be covered with the waterproof layer 873.

The thickness of the waterproof layer 85 is greater than or equal to 100 nanometers and less than or equal to 600 nanometers, the impedance of the waterproof layer 85 in the thickness direction is less than or equal to 100 milliohms, and the waterproof layer 85 includes a first material in the form of particles with a particle size less than or equal to 100 nanometers. In this way, on the one hand, the waterproof effect of the circuit board 80 can be ensured, on the other hand, the second type of electronic component 86 can be electrically connected to external ports.

In this example, the waterproof layer 85 is covered by plasma-enhanced chemical vapor deposition on the whole formed by the waterproof layer 85 and the first type of electronic component 84, which can improve the consistency of the thickness of the waterproof layer 85. The waterproof layer 85 has strong adhesion ability to prevent the waterproof layer 85 from detaching. The use of plasma-enhanced chemical vapor deposition can also have reduced impact on the structure and physical properties of the circuit board 80.

It can be understood that, in other examples, the printed circuit layer may be provided on both the first surface and the second surface of the substrate board, so that the printed circuit layer on the first surface and the second surface are both covered by the waterproof layer.

What is claimed is:

1. A riding lawn mower, comprising:
   a seat for a user to sit thereon; and
   a cutting system comprising a mowing element for cutting vegetation, a deck, and a first motor, the deck surrounding and forming a mowing space accommodating at least part of the mowing element, and the first motor operably coupled to the mowing element to drive the mowing element to rotate relative to the deck;
   wherein the first motor comprises a rotor assembly comprising a rotor shaft enabled to rotate about a rotation axis, a stator assembly comprising a stator coil and a stator core, and a motor housing surrounding and forming an accommodation cavity accommodating at least part of the stator assembly, the rotor shaft passes through the motor housing in a direction of the rotation axis and is at least partially located outside the motor housing, and the deck is formed with a first through hole, the first motor passes through the first through hole such that the motor housing is at least partially located in the mowing space, and
   wherein the motor housing comprises a first housing portion formed with a second through hole that the rotor shaft passes through and a second housing portion abutted with the first housing portion to surround and form the accommodation cavity, the first motor further comprises a fastener fastening the first housing portion and the second housing portion together, the fastener passes through the deck to mount the first motor to the deck, the first housing portion is formed with a first flange portion extending in a radial direction perpendicular to the rotation axis, the second housing portion is formed with a second flange portion extending in a radial direction perpendicular to the rotation axis, and the first motor further comprises a fastener sequentially passing through the deck, the first flange portion, and the second flange portion.

2. The riding lawn mower of claim 1, wherein the first through hole passes through the deck along the direction of the rotation axis.

3. The riding lawn mower of claim 1, wherein the deck is recessed toward the mowing element to form a groove and the first through hole is provided at a bottom of the groove.

4. The riding lawn mower of claim 1, wherein the motor housing is formed with a mounting portion mounting the first motor to the deck, the deck is formed with a supporting portion around the first through hole supporting the mounting portion, and a dimension of the mounting portion in a radial direction perpendicular to the rotation axis is larger than a dimension of the first through hole in this direction.

5. The riding lawn mower of claim 4, wherein an airflow channel communicating with the first through hole is formed between the supporting portion and the mounting portion and the airflow channel allows a cooling airflow outside the mowing space to pass through the airflow channel and the first through hole to enter the mowing space when the mowing element rotates.

6. The riding lawn mower of claim 1, wherein a cooling airflow that flows from an outside of the mowing space through the first motor and into the inside of the mowing space through the first through hole is generated when the mowing element rotates.

7. The riding lawn mower of claim 1, wherein a ratio of a size of a portion of the motor housing in the mowing space in the direction of the rotation axis to a size of the motor housing in the direction of the rotation axis is greater than or equal to 0.3 and less than or equal to 1.

8. The riding lawn mower of claim 1, further comprising:
a body supporting the cutting system; and
a circuit board mounted to the body comprises a substrate board having a first surface and a second surface, a printed circuit layer arranged on the first surface, an insulating layer covering an upper side of the printed circuit layer arranged to expose a first conductive portion and a second conductive portion on the printed circuit layer, a first type of electronic component comprising a first connecting portion electrically connected to the first conductive portion and a second connecting portion electrically connected to the second conductive portion, and a waterproof layer covering at least part of a whole formed by the insulating layer and the first type of electronic component with a substantially same thickness through vapor deposition with the first connecting portion and the second connecting portion being insulated from each other on a path through which the waterproof layer is connected after the waterproof layer covers the first type of electronic component.

9. The riding lawn mower of claim 8, wherein the circuit board further comprises a second type of electronic component comprising a third connecting portion and a fourth connecting portion, the insulating layer covering the upper side of the printed circuit layer is further arranged to expose a third conductive portion and a fourth conductive portion, the third connecting portion is electrically connected to the third conductive portion, the fourth connecting portion is electrically connected to the fourth conductive portion, the waterproof layer covers the second type of electronic component, the third connecting portion and the fourth connecting portion are insulated from each other on a path through which the waterproof layer is connected after the waterproof layer covers the second type of electronic component, and the second type of electronic component further comprises a current access terminal enabled to electrically connect with an external terminal after being covered by the waterproof layer to introduce current to the circuit board.

10. The riding lawn mower of claim 9, wherein the second type of electronic component is a plug interface.

11. The riding lawn mower of claim 8, wherein both the first surface and the second surface are provided with the printed circuit layer.

12. The riding lawn mower of claim 8, wherein both the printed circuit layer on the first surface and the second surface are covered by the waterproof layer.

13. The riding lawn mower of claim 8, wherein the waterproof layer covers the whole formed by the insulating layer, the printed circuit layer, and the first type of electronic component.

14. The riding lawn mower of claim 8, wherein a thickness of the waterproof layer is greater than or equal to 100 nanometers and less than or equal to 600 nanometers.

15. The riding lawn mower of claim 8, wherein an impedance of the waterproof layer in a thickness direction is less than or equal to 100 milliohms.

16. The riding lawn mower of claim 8, wherein the waterproof layer comprises a first material in a form of particles with a particle size of less than or equal to 100 nanometers.

17. The riding lawn mower of claim 8, wherein the waterproof layer adopts plasma-enhanced chemical vapor deposition to cover at least part of the whole constituted by the waterproof layer and the first type of electronic components.

18. A riding lawn mower, comprising:
a seat for a user to sit thereon;
a body supporting a cutting system;
the cutting system comprising a mowing element for cutting vegetation, a deck, and a first motor, the deck surrounding and forming a mowing space accommodating at least part of the mowing element, and the first motor configured to drive the mowing element to rotate relative to the deck; and
a circuit board mounted to the body;
wherein the first motor comprises:
a rotor assembly comprising a rotor shaft enabled to rotate about a rotation axis;
a stator assembly, comprising a stator coil and a stator core; and
a motor housing surrounding and forming an accommodation cavity accommodating at least part of the stator assembly;
wherein the circuit board comprises a substrate board having a first surface and a second surface, a printed circuit layer arranged on the first surface, an insulating layer covering an upper side of the printed circuit layer arranged to expose a first conductive portion and a second conductive portion on the printed circuit layer, a first type of electronic component comprising a first connecting portion electrically connected to the first conductive portion and a second connecting portion electrically connected to the second conductive portion, and a waterproof layer covering at least part of a whole formed by the insulating layer and the first type of electronic component with a substantially same thickness through vapor deposition with the first connecting portion and the second connecting portion being insulated from each other on a path through which the waterproof layer is connected after the waterproof layer covers the first type of electronic component.

19. A riding lawn mower, comprising:

a cutting system comprising a mowing element for cutting vegetation, a deck, and a first motor, the deck surrounding and forming a mowing space accommodating at least part of the mowing element, and the first motor configured to drive the mowing element to rotate relative to the deck;

wherein the first motor comprises a rotor assembly comprising a rotor shaft enabled to rotate about a rotation axis, a stator assembly comprising a stator coil and a stator core, and a motor housing surrounding and forming an accommodation cavity accommodating at least part of the stator assembly, the rotor shaft passes through the motor housing in a direction of the rotation axis and is at least partially located outside the motor housing, the deck is formed with a first through hole through which the first motor passes such that the motor housing is at least partially located in the mowing space, and a ratio of a size of a portion of the motor housing in the mowing space in the direction of the rotation axis to a size of the motor housing in the direction of the rotation axis is greater than or equal to 0.3 and less than or equal to 1 so that a portion of a side wall of the motor housing is located in the mowing space.

\* \* \* \* \*